United States Patent
Ahn et al.

(10) Patent No.: US 11,182,301 B2
(45) Date of Patent: Nov. 23, 2021

(54) STORAGE DEVICES INCLUDING A PLURALITY OF PLANES AND METHODS OF OPERATING THE STORAGE DEVICES

(71) Applicant: Samsung Electronics Co., Ltd., Suwon-si (KR)

(72) Inventors: Jin-oh Ahn, Bucheon-si (KR); Hyun-wook Shin, Yongin-si (KR); Walter Jun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 40 days.

(21) Appl. No.: 16/546,598

(22) Filed: Aug. 21, 2019

(65) Prior Publication Data
US 2020/0151106 A1     May 14, 2020

(30) Foreign Application Priority Data
Nov. 9, 2018 (KR) .................. 10-2018-0137599

(51) Int. Cl.
*G06F 12/0882* (2016.01)
*G06F 3/06* (2006.01)
(Continued)

(52) U.S. Cl.
CPC ........ *G06F 12/0882* (2013.01); *G06F 3/0656* (2013.01); *G06F 3/0658* (2013.01);
(Continued)

(58) Field of Classification Search
CPC .. G06F 12/0882; G06F 3/0656; G06F 3/0658; G06F 3/0659; G06F 3/0679;
(Continued)

(56) References Cited

U.S. PATENT DOCUMENTS

| 7,949,819 B2 | 5/2011 | Kang et al. |
| 9,324,450 B2 | 4/2016 | Jigour et al. |
| (Continued) | | |

FOREIGN PATENT DOCUMENTS

| KR | 100590388 B1 | 6/2006 |
| KR | 2009-0000370 A | 1/2009 |

OTHER PUBLICATIONS

Search Report for European Application No. 19207470.6 dated Apr. 20, 2020.

*Primary Examiner* — Sean D Rossiter
(74) *Attorney, Agent, or Firm* — Harness, Dickey & Pierce, P.L.C.

(57) ABSTRACT

In a method of operating a storage device including a non-volatile memory (NVM), the non-volatile memory including a memory cell array, the memory cell array including a first plane and a second plane, the method includes receiving a read command set for data sensing of the first and second plane; simultaneously loading first page data stored in the first plane into a first page buffer of the first plane and second page data stored in the second plane into a second page buffer of the second plane based on the read command set; receiving a data output command set that includes the first plane; and continuously transmitting the first page data and the second page databased on the data output command set.

19 Claims, 21 Drawing Sheets

(51) Int. Cl.
*G06F 12/02* (2006.01)
*G11C 11/56* (2006.01)

(52) U.S. Cl.
CPC .......... *G06F 3/0659* (2013.01); *G06F 3/0679* (2013.01); *G06F 3/0688* (2013.01); *G06F 12/0246* (2013.01); *G11C 11/5642* (2013.01); *G06F 3/0607* (2013.01)

(58) Field of Classification Search
CPC .. G06F 3/0688; G06F 12/0246; G06F 3/0607; G06F 2212/1024; G06F 2212/7203; G11C 11/5642; G11C 16/26
See application file for complete search history.

(56) References Cited

U.S. PATENT DOCUMENTS

| | | |
|---|---|---|
| 9,659,638 B1 | 5/2017 | Shin |
| 10,002,671 B2 | 6/2018 | Shimizu et al. |
| 2006/0203548 A1 | 9/2006 | You |
| 2014/0258596 A1 | 9/2014 | Kojima |
| 2016/0070507 A1 | 3/2016 | Hoshikawa et al. |
| 2016/0299844 A1 | 10/2016 | Sprouse et al. |
| 2017/0185319 A1 | 6/2017 | Kim et al. |
| 2018/0211707 A1* | 7/2018 | Nosaka .................. G11C 16/10 |
| 2019/0057026 A1* | 2/2019 | Park ..................... G06F 3/0659 |
| 2020/0098436 A1* | 3/2020 | Kim ....................... G11C 16/24 |

* cited by examiner

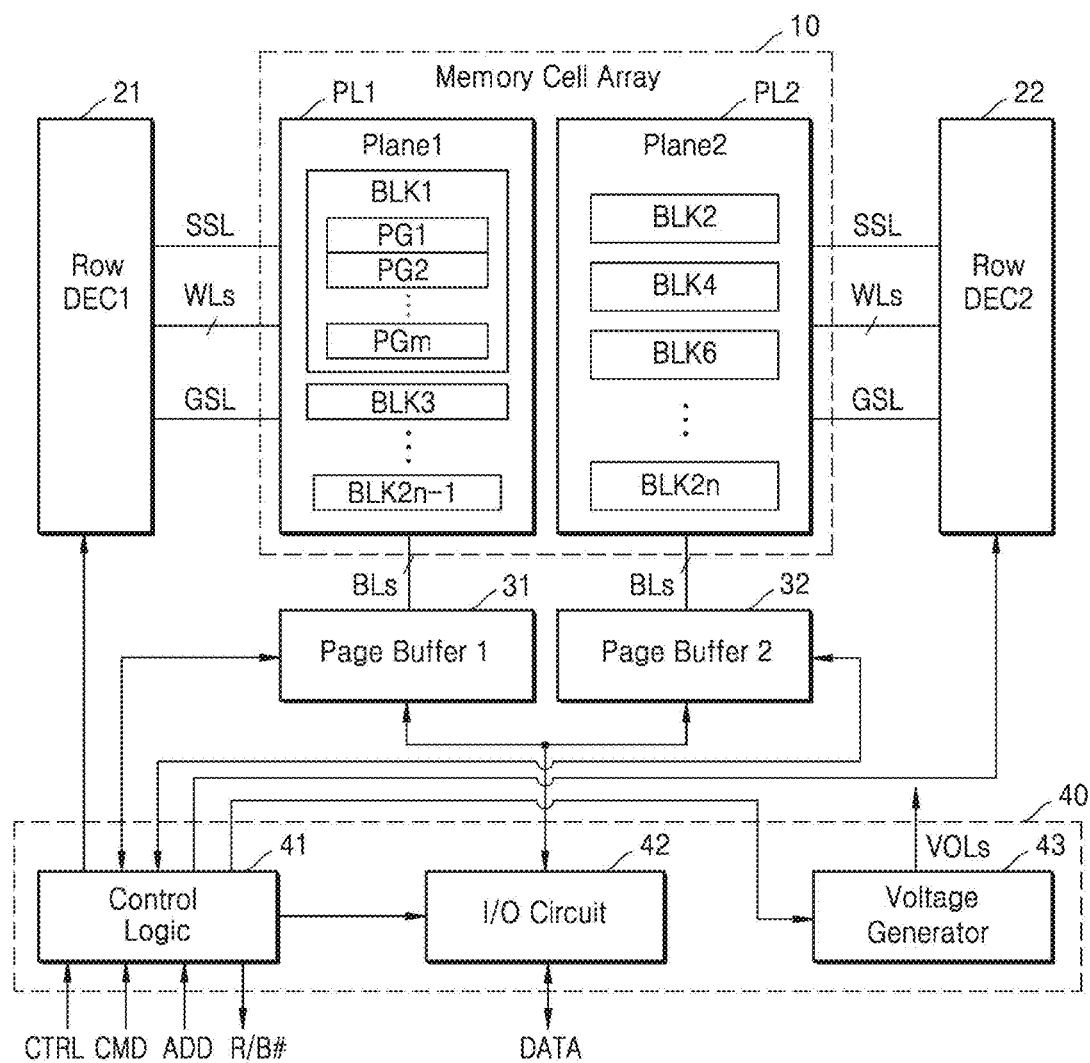

STORAGE DEVICES INCLUDING A PLURALITY OF PLANES AND METHODS OF OPERATING THE STORAGE DEVICES

CROSS-REFERENCE TO RELATED PATENT APPLICATION

This application claims the benefit of Korean Patent Application No. 10-2018-0137599, filed on Nov. 9, 2018, in the Korean Intellectual Property Office, the disclosure of which is incorporated herein in its entirety by reference.

BACKGROUND

Some example embodiments of some inventive concepts relate to storage devices, and including storage devices including a nonvolatile memory, and/or methods of operating storage devices.

As a nonvolatile memory, a flash memory may retain stored data even when power is turned off. Recently, storage devices including the flash memory such as embedded MultiMedia Card (eMMC), Universal Flash Storage (UFS), Solid State Drive (SSD), and the like have been widely used, and are useful for storing or moving a large amount of data.

SUMMARY

Some example embodiments of some inventive concepts include a method of operating a storage device including a non-volatile memory, the non-volatile memory including a memory cell array, and the memory cell array including a first plane and a second plane. The method includes receiving a read command set for data sensing including the first plane and the second plane; simultaneously loading first page data stored in the first plane into a first page buffer of the first plane and second page data stored in the second plane into a second page buffer of the second plane based on the read command set; receiving a data output command set that includes the first plane; and continuously transmitting the first page data and the second page databased on the data output command set.

Some example embodiments of some inventive concepts include a method of operating a storage device including a non-volatile memory including a plurality of planes. The method includes receiving a read-output command set for data sensing; and based on the read-output command set, sensing data output for at least two of the plurality of planes, loading at least two page data that are stored in the at least two planes of the plurality of planes into at least two page buffers that are respectively connected to the at least two planes, and continuously outputting the at least two page data.

Some example embodiments of some inventive concepts include a storage device including a non-volatile memory, the non-volatile memory including a memory cell array, the memory cell array including a plurality of planes, respective planes of the plurality of planes being connected to a page buffer, wherein the non-volatile memory is configured to simultaneously load a first page data that is stored in a first plane of the plurality of planes into a first page buffer of the first plane and a second page data that is stored in a second plane of the plurality of planes into a second page buffer of the second plane, and output the first page data and the second page data based on a data output command set; and a memory controller configured to transmit the read command set and the data output command set to the non-volatile memory, and receive the first page data and the second page data from the non-volatile memory, wherein the non-volatile memory is further configured to receive a first data output command set that identifies a column address of one page buffer of the at least two page buffers from the memory controller, output first page data loaded into the one page buffer based on the first data output command set, and output another page data loaded into another page buffer based on the first data output command rather than another data output command set that identifies a column address of the another page buffer.

BRIEF DESCRIPTION OF THE DRAWINGS

Example embodiments of some inventive concepts may be more clearly understood from the following detailed description taken in conjunction with the accompanying drawings in which:

FIG. 3 is a block diagram illustrating an implementation example of a non-volatile memory according to an example embodiment of some inventive concepts;

DETAILED DESCRIPTION

Figure 1:
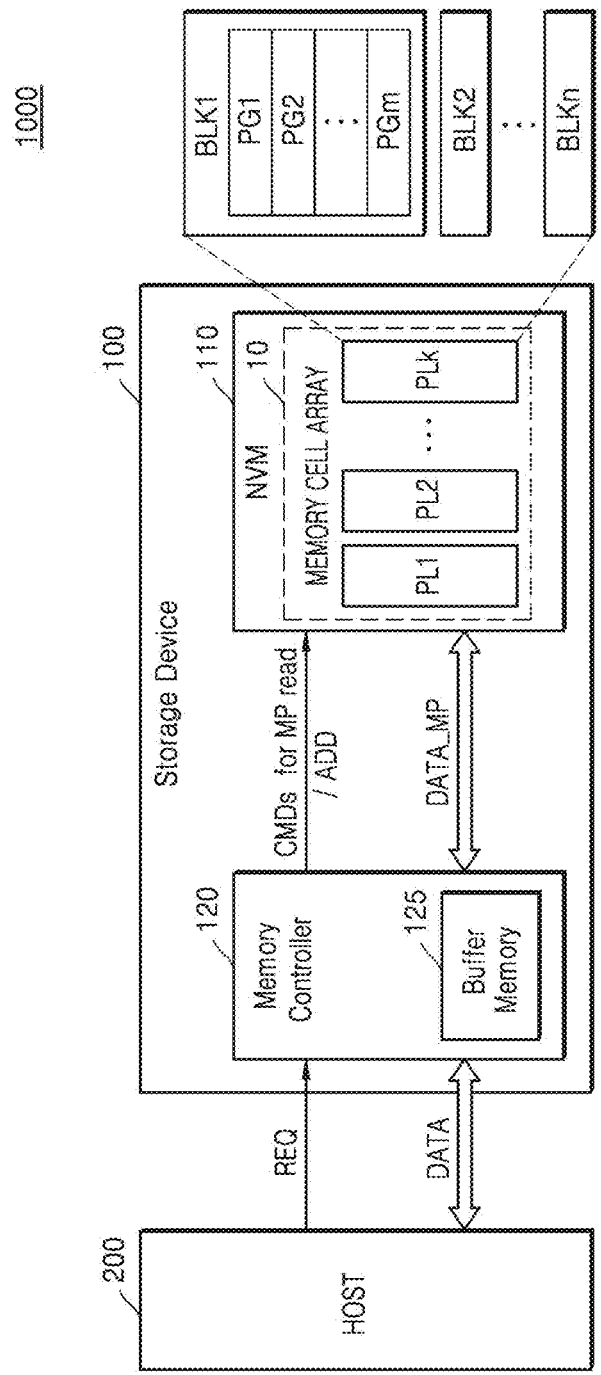
FIG. 1 is a block diagram illustrating a storage system according to an example embodiment of some inventive concepts.

FIG. 1 is a block diagram illustrating a storage system 1000 according to an example embodiment of some inventive concepts.

The storage system 1000 may be embedded in an electronic device or implemented in the electronic device. The electronic device may be implemented as, for example, a personal computer (PC), a data server, an UMPC (Ultra Mobile PC), a workstation, a netbook, network-attached storage (NA), a smart television, an Internet of Things (IoT) device, and/or a portable electronic device. The portable electronic device may be implemented as, for example, a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, and/or a wearable device.

Referring to FIG. 1, the storage system 1000 may include a storage device 100 and a host 200. The storage device 100 may include a non-volatile memory (NVM) 110 and a memory controller 120. In some example embodiments, the memory controller 120 and/or the non-volatile memory array 110 may include hardware such as logic circuits; a hardware/software combination, such as a processor executing software; or a combination thereof. For example, a processor of the storage device 100, including the memory controller 120 and/or the non-volatile memory 110, and/or the host 200 may include, but are not limited to, a central processing unit (CPU), a graphics processing unit (GPU), an arithmetic logic unit (ALU), a digital signal processor, an application processor, a microcomputer, a field programmable gate array (FPGA), a System-on-Chip (SoC), a programmable logic unit, a microprocessor, an application-specific integrated circuit (ASIC), etc.

The host 200 may store data in the storage device 100 and read data from the storage device 100. The host 200 may refer to a data processing device capable of processing data such as a Central Processing Unit (CPU), a processor, a microprocessor, an application processor), or the like. For example, the host 200 may be implemented as a system-on-a-chip (SoC).

The host 200 may communicate with the storage device 100 through various interfaces. The host 200 may transmit an access request REQ for storing data or reading data to the storage device 100. The storage device 100 may operate based on the access request REQ, for example, a write/read request, received from the host 200 and may store data DATA received from the host 200. The storage device 100 may include the NVM 110 and the memory controller 120 and thus may be referred to as a memory system.

The storage device 100 may be implemented as one of various types of devices according to a host interface protocol connected to the host 200. For example, the storage device 100 may be an internal memory embedded in an electronic device. For example, the storage device 100 may be implemented as one of various types of devices such as embedded Multimedia Card (eMMC), Multimedia Card (MMC), Solid state Drive (SSD), Universal Flash Storage (UFS), embedded Universal Flash Storage (eUFS), Reduced Size MMC (RS-MMC), micro-MMC, Reduced Size MMC (RS-MMC), Compact Flash (CF) card, Secure Digital (SD) card, Micro Secure Digital (Micro-SD) card, Mini Secure Digital (Mini-SD) card, extreme Digital (xD) card, Smart Media card, Memory Stick, and the like.

The NVM 110 may store data and may include a memory cell array 10 (MCA) including non-volatile memory cells capable of maintaining data when the storage device 100 is powered off. In an example embodiment, the NVM 110 may be a NAND flash memory device. However, some example embodiments of some inventive concepts are not limited thereto. For example, in some example embodiments, the NVM 110 may be resistive memory devices such as resistive RAM (ReRAM), phase change RAM (PRAM), and magnetic RAM (MRAM). In some example embodiments presented herein, the NVM 110 is a NAND flash memory device.

The memory cell array 10 may be divided into a plurality of planes PL1 to PLk. A page buffer (or a page register) may be connected to each of the plurality of planes PL1 to PLk. Each of the plurality of planes PL1 to PLk may include a plurality of memory blocks BLK1 to BLKn. Each of the plurality of memory blocks BLK1 to BLKn may include a plurality of pages PG1 to PGm, where k, n, and m may be positive integers and may be variously changed according to an example embodiment.

In some example embodiments, the NVM 110 may include a plurality of dies and/or a plurality of chips. For example, the NVM 110 may include a plurality of chips, each of the plurality of chips may include a plurality of dies, and each of the plurality of dies may include a plurality of planes.

The NVM 110 may perform program and read operations in units of pages and perform an erase operation in units of memory blocks. In some example embodiments, the NVM 110 may perform a multi-plane read operation (such as a simultaneous read operation or a sequential read operation) to read data from at least two of the plurality of planes PL1 to PLk.

The memory controller 120 may control the NVM 110 to read the data DATA stored in the NVM 110 based on a read request from the host 200 and/or write the data DATA to the NVM 110 based on a program request from the host 200. As used herein, "based on" may include "in response to;" e.g., an example embodiment may perform an operation "based on" a command by awaiting, receiving, detecting, and/or responding to a command to perform the operation. The memory controller 120 may include a buffer memory 125, and the data DATA received from the host 200 or the NVM 110 may be temporarily stored in the buffer memory 125 and then transmitted to the NVM 110 or the host 200. In some example embodiments, the memory controller 120 may control the multi-plane read operation of the NVM 110 by transmitting command sets CDMs indicating the multi-plane read operation to the NVM 110.

In some example embodiments, the memory controller 120 may transmit a read command set for data sensing including at least two of the plurality of planes PL1 to PLk, and a data output command set with respect to a selected one of the at least two planes to the NVM 110. The read command set and the data output command set may include an address ADD for selecting a plane, a memory block, a page, a column (e.g., a portion of a page), and the like.

The NVM 110 may, based on the read command set, sense page data stored in each of at least two planes simultaneously. In some example embodiments, the NVM 110 may sense first page data stored in a first plane and second page data stored in a second plane and load the sensed page data into the page buffer. Accordingly, the page data stored in each of the at least two planes may be simultaneously loaded into at least two page buffers connected to each of the at least two planes (e.g., at least a portion of a first plane may be loaded into a first page buffer while at least a portion of a second plane is loaded into a second page buffer).

In other example embodiments, the at least two portions of page data respectively loaded into the at least two page buffers may be sequentially output to the memory controller 120. The NVM 110 may output the page data of one plane selected based on the data output command set among the at least two page data stored in the at least two page buffers to the memory controller 120 and then switch planes and output the page data of the other plane to the memory controller 120. That is, the NVM 110 may output the page data loaded into each of the at least two page buffers, for example, multi-plane page data DATA_MP, to the memory controller 120, by switching planes from which data is output based on the data output command set rather than another data output command set identifying the other plane (e.g., without awaiting and/or receiving the data output command set for the other plane). The memory controller 120 may temporarily store the multi-plane page data DATA_MP received from the NVM 110 in the buffer memory 125 and then transmit the multi-plane page data DATA_MP to the host 200.

In an example embodiment, the data output command set may include a column address that identifies a column of the page buffer of the selected plane, and the NVM 110 may store all or part of the page data loaded into the page buffer, based on the column address.

In an example embodiment, the memory controller 120 may receive the page data of the selected plane based on the data output command set and transmit a plane switching command to the NVM 110, and the NVM 110 may output the page data of the other plane based on the plane switching command.

In some example embodiments, the memory controller 120 may transmit a read-out command set for data sensing and sensing data output with respect to at least two of the planes PL1 to PLk to the NVM 110, and the NVM 110 may, based on the read-out command set, simultaneously load page data stored in each of the at least two planes, for example, at least two portions of page data, into a sensing and page buffer and may continuously output the at least two page data, for example, the multi-plane page data DATA_MP, to the memory controller 120, e.g., outputting first page data and also second page data based on a read-out command set indicating output of the first page data, rather than outputting the first page data based on a first data output command set, awaiting another data output command set, and outputting the second page data based on the another data output command set.

The multi-plane read operation of the storage device 100 according to the above-described various example embodiments may be described in more detail with reference to FIGS. 2 and 6 to 15.

In the storage system 1000 according to an example embodiment, when performing the multi-plane read operation, the NVM 110 may output page data of another plane automatically and/or based on a plane switching signal after page data of one plane is output, instead of switching (or selecting) planes from which data is output based on a plurality of data output command sets for each of the plurality of planes PL1 to PLk. Accordingly, a delay incurred while switching planes from which data is output may be reduced, and thus, the read performance of the storage device 100 and the storage system 1000 may be improved.

Figure 2:
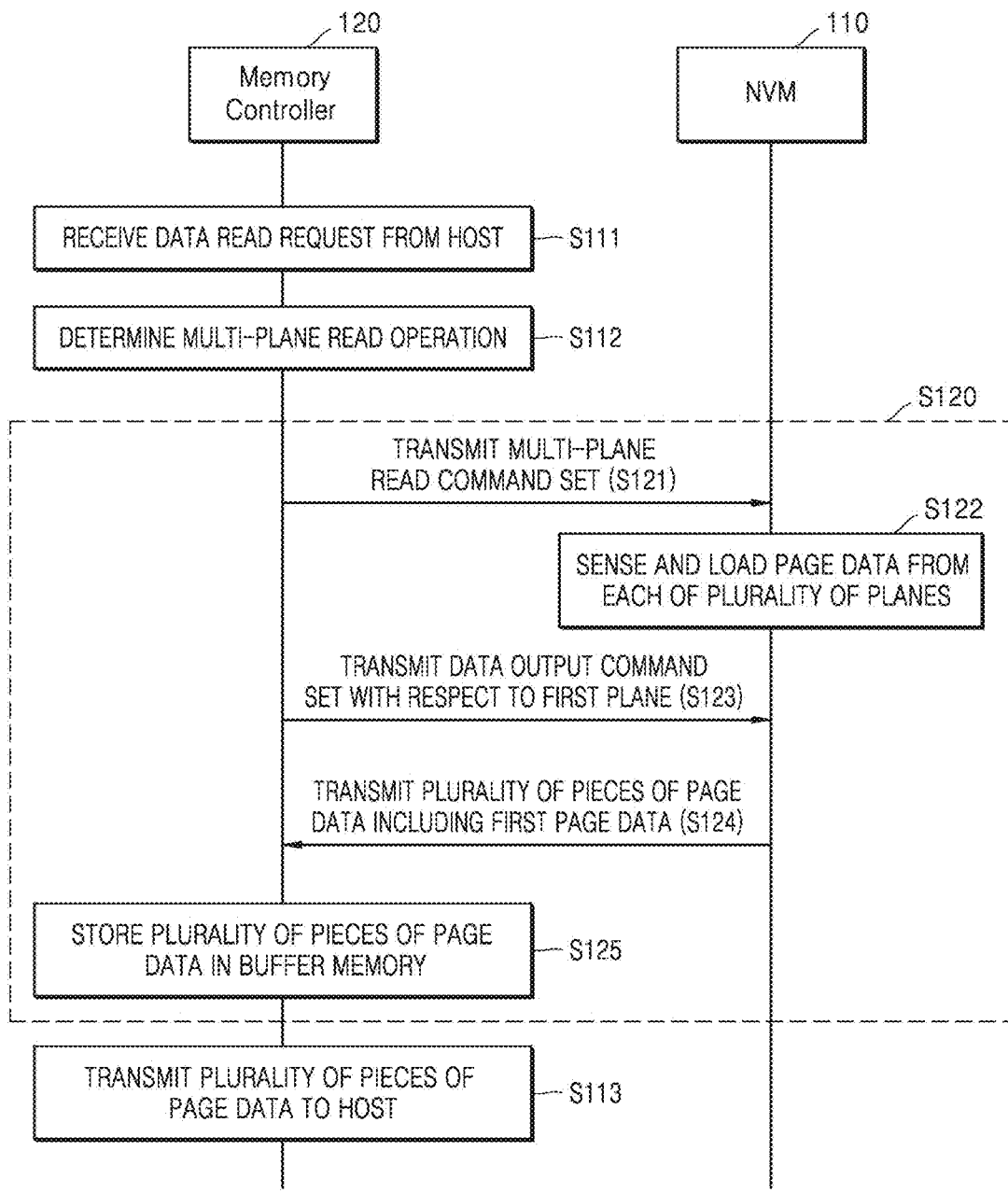
FIG. 2 is a flowchart illustrating a method of operating a storage device according to an example embodiment of some inventive concepts.

FIG. 2 is a flowchart illustrating a method of operating a storage device, according to an example embodiment of some inventive concepts. FIG. 2 specifically shows an example of a reading method of the storage device.

Referring to FIG. 2, the memory controller 120 may receive a data read request from a host (200 in FIG. 1) (S111). The memory controller 120 may receive a read command and an address, such as a logical address.

The memory controller 120 may determine a multi-plane read operation based on the logical address received from the host (S112). For example, the memory controller 120 may convert the logical address into a physical address corresponding to a physical storage area of the NVM 110, and when the converted physical address indicates pages included in each of a plurality of planes, determine to perform the multi-plane read operation. For example, when the physical address indicates a page of a memory block provided in a first plane and a page of a memory block provided in a second plane, the memory controller 120 may determine to perform the multi-plane read operation. In an example embodiment, the memory controller 120 may perform the multi-plane read operation when the page of the first plane and a corresponding page of the second plane (e.g., when the multi-plane read operation indicates page PG1 of the first plane and also page PG1 of the second plane).

Thereafter, the multi-plane read operation may be performed (S120). The memory controller 120 may transmit a multi-plane read command set to the NVM 110 (S121). The multi-plane read command set may instruct data sensing with respect to a plurality of planes (at least two planes) of the NVM 110. The multi-plane read command set may include addresses for each of the plurality of planes (e.g., a sequence of addresses of four planes) and a command representing a multi-plane read, for example, operation code.

The NVM 110 ma, sense page data from each of the plurality of planes and load the sensed page data in a plurality of page buffers (at least two page buffers) respectively connected to the plurality of planes (S122) based on the multi-plane read command set.

When loading of the page data is completed, a plurality of portions of page data loaded in the plurality of page buffers may be output to the memory controller 120. The memory controller 120 may transmit a data output command set for the first plane of the plurality of planes to the NVM 110 (S123). In this example, the first plane is intended to mean one of the plurality of planes. The data output command set may include a random-access data output command and an address of the first plane. In an example embodiment, the data output command set may further include a column address and a column selection command for selecting a column of a first page buffer of the first plane.

The NVM 110 may transmit the plurality of portions of page data including the first page data to the memory controller 120 (S124). In this example, the first page data includes page data sensed from the first plane. Based on the data output command set, the NVM 110 may output the first page data of the first plane, and thereafter change the plane on which the page data is output to output page data of another plane. That is, the NVM 110 may change planes to output the plurality of portions of page data of the plurality of planes rather than another data output command set for another plane (e.g., without awaiting and/or receiving another data output command set for another plane).

The memory controller 120 may store the plurality of portions of page data received from the NVM 110 in a buffer memory 125 (e.g., 125 in FIG. 1) (S125). Then, the memory controller 120 may transmit the data stored in the buffer memory, for example, the plurality of portions of page data, to the host (S113).

FIG. 3 is a block diagram illustrating an implementation example of a non-volatile memory 110a according to an example embodiment of some inventive concepts. The non-volatile memory 110a may have a multi-plane structure. In FIG. 3, the non-volatile memory 110a is shown as having a two-plane structure including two planes, for example, a first plane PL1 and a second plane PL2, but this is for convenience of description only. The non-volatile memory 110a may be implemented in a variety of multi-plane structures including four or more plane structures, such as a four-plane structure or a six-plane structure.

Referring to FIG. 3, the non-volatile memory 110a may include a memory cell array 10, a first row decoder 21, a second row decoder 22, a first page buffer 31, a second page buffer 32, and a peripheral circuit 40. The peripheral circuit 40 may include a control logic 41, an input/output circuit 42, and a voltage generator 43.

The memory cell array 10 may include a first plane PL1 and a second plane PL2. Each of the first plane PL1 and the second plane PL2 may include a plurality of memory blocks, for example, n memory blocks. The memory blocks included in the first plane PL1 may be set to odd number blocks (e.g., BLK1, BLK3, . . . , BLK2n−1). The memory blocks included in the second plane PL2 may be set to even number blocks (e.g., BLK2, BLK4, BLK6, . . . , BLK2n). Each of the plurality of memory blocks BLK1 to BLK2n may include a plurality of pages, for example, m pages.

Each of the plurality of memory blocks BLK1 to BLK2n may be implemented as a NAND flash memory having a two-dimensional (2D) horizontal structure in which memory cells are two-dimensionally arranged on the same layer or a three-dimensional (3D) vertical structure in which non-volatile memory cells are three-dimensionally arranged.

A memory cell may be a single level cell (SLC) storing one bit of data or a multi-level cell (MLC) storing two or more bits of data, but is not limited thereto. Each memory cell may be a triple level cell (TLC) storing 3-bit data or a quadruple level cell storing 4-bit data.

Each of the plurality of memory blocks BLK1 to BLK2n of the first plane PL1 and the second plane PL2 may be connected to an address decoder, that is, the first row decoder 21 or the second row decoder 22, through word lines WLs, at least one string selection line SSL, and at least one ground selection line GSL. The memory blocks BLK1, BLK3, . . . , BLK2n−1 of the first plane PL1 may be connected to the first row decoder 21. The memory blocks BLK2, BLK4, BLK6, . . . , BLK2n of the second plane PL2 may be coupled to the second row decoder 22.

The plurality of memory blocks BLK1 to BLK2n of the first plane PL1 and the second plane PL2 may be connected to the first page buffer 31 and/or the second page buffer 32 through bit lines BLs. The memory blocks BLK1, BLK3, . . . , BLK2n−1 of the first plane PL1 may be connected to the first page buffer 31. The memory blocks BLK2, BLK4, BLK6, . . . , BLK2n of the second plane PL2 may be connected to the second page buffer 32.

Each of the first row decoder 21 and the second row decoder 22 may be connected to the corresponding plane PL1 or PL2 through the word lines WLs, the at least one string select line SSL, and the at least one ground select line GSL and may select one of the word lines WLs, the string selection line SSL, and the ground selection line GSL using a row address provided from the control logic 41.

Each of the first page buffer 31 and the second page buffer 32 may be connected to the corresponding plane PL1 or PL2 through the bit lines BLs and may select some of the bit lines BLs based on a column address provided from the control logic 41. The first page buffer 31 and the second page buffer 32 may operate as write drivers or sense amplifiers according to an operation mode. In a read operation, the first page buffer 31 and the second page buffer 32 may operate as sense amplifiers to sense and load page data stored in the memory cell array 10. In a write operation, the first page buffer 31 and the second page buffer 32 may operate as write drivers to program page data to be written in the memory cell array 10.

The first row decoder 21 and the first page buffer 31 may select one of the memory blocks BLK1, BLK3, . . . , BLK2n−1 of the first plane PL1 and one of a plurality of pages PG1 to PGm of the selected memory block based on provided addresses (e.g., the row address and the column address) and perform a read operation or a write operation (a program operation) on the selected page. The first row decoder 21 and the first page buffer 31 may also select one of the memory blocks BLK1, BLK3, . . . , BLK2n−1 of the first plane PL1 and perform an electrical erase operation on the selected memory block.

The second row decoder 22 and the second page buffer 32 may perform a read operation, a write (program) operation, an erase operation on the second plane PL2 in the same or similar manner as the operations of the first row decoder 21 and the first page buffer 31.

The control logic 41 may control the overall operation (program/read/erase, etc.) of the non-volatile memory 110a. The control logic 41 may output various signals for programming data to the first plane PL1 and the second plane PL2 of the memory cell array 10, reading the data, or erasing the data based on a command CMD, an address ADD, and a control signal CTRL (for example, write enable signal, read enable signal, latch enable signals and the like) received from a memory controller (120 of FIG. 1). For example, the control logic 41 may output a row address, a column address, and a voltage control signal. The control logic 41 may also transmit a state signal R/B # indicating a state of the non-volatile memory 110a (e.g., R, indicating ready, or B #, indicating busy) to the memory controller 120. In some example embodiments, the control logic 41 may include hardware such as logic circuits; a hardware/software combination, such as a processor executing software; or a combination thereof. For example, a processor of the control logic 41 may include, but is not limited to, a central processing unit (CPU), a graphics processing unit (GPU), an arithmetic logic unit (ALU), a digital signal processor, an application processor, a microcomputer, a field programmable gate array (FPGA), a System-on-Chip (SoC), a programmable logic unit, a microprocessor, an application-specific integrated circuit (ASIC), etc.

In some example embodiments, the control logic 41 may perform the multi-plane read operation based on command sets received from the memory controller 120. For example, the control logic 41 may control elements (e.g., the first row decoder 21 and the second row decoder 22, the first page buffer 31 and the second page buffer 32, the input/output circuit 42, and the voltage generator 43 of the non-volatile memory 110a) to perform the multi-plane read operation based on the command sets received from the memory controller 120 (e.g., a read command set and a write command set) and/or based on a read-out command set.

The input/output circuit 42 may receive and buffer the data DATA from the memory controller 120 and transmit the data DATA to the first page buffer 31 or the second page buffer 32 or, under control of the control logic 41, buffer the data DATA output from the first page buffer 31 or the second page buffer 32 and transmit the data DATA to the memory controller 120 through a plurality of input/output pins (or a data bus). In some example embodiments, the input/output circuit 42 may transmit and receive the data DATA in a unit of one byte, for example, 8 bits, or two bytes, for example, 16 bits.

The voltage generator 43 may generate various kinds of voltages VOLs used to perform program, read, and erase operations on the memory cell array 10. For example, the voltage generator 43 may generate a program voltage (or a write voltage), a read voltage, a program inhibit voltage, a read inhibit voltage, a verify voltage, and/or a program verify voltage provided to the word lines WLs. Also, the voltage generator 43 may generate voltages provided to the string selection lines SSL and the ground selection lines GSL, according to operations of the non-volatile memory 110*a*.

The voltages VOLs generated in the voltage generator 43 may be provided to the plurality of memory blocks BLK1 to BLK2 through the first row decoder 21 and the second row decoder 22 and the first page buffer 31 and the second page buffer 32, and thus a write operation, a read operation, an erase operation, and a verify operation (e.g., program verify, erase verify, and the like) may be performed on the plurality of memory blocks BLK1 to BLKk.

Figure 4A:
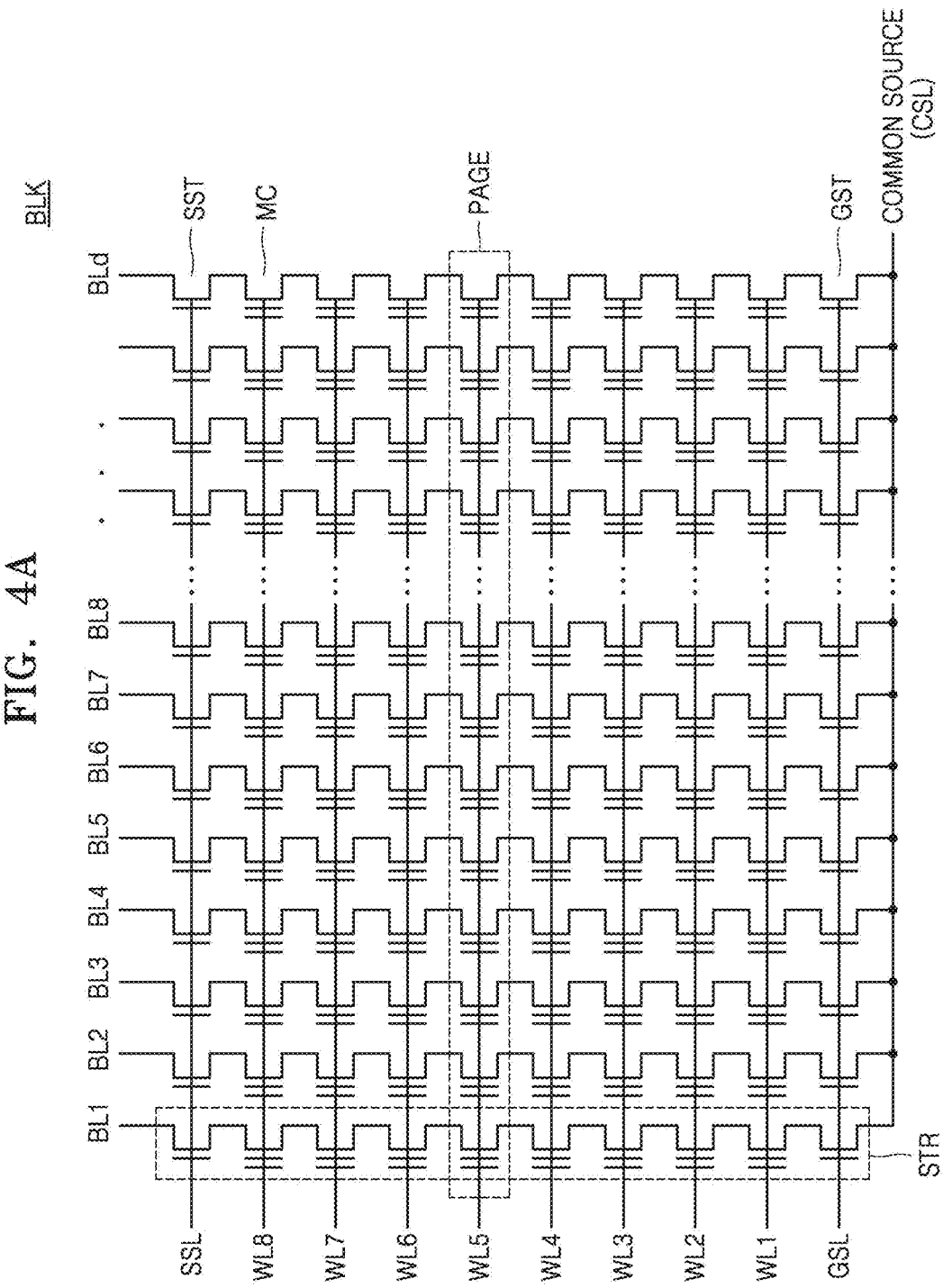
FIGS. 4A and 4B are circuit diagrams illustrating a memory block of FIG. 3.
Figure 4B:
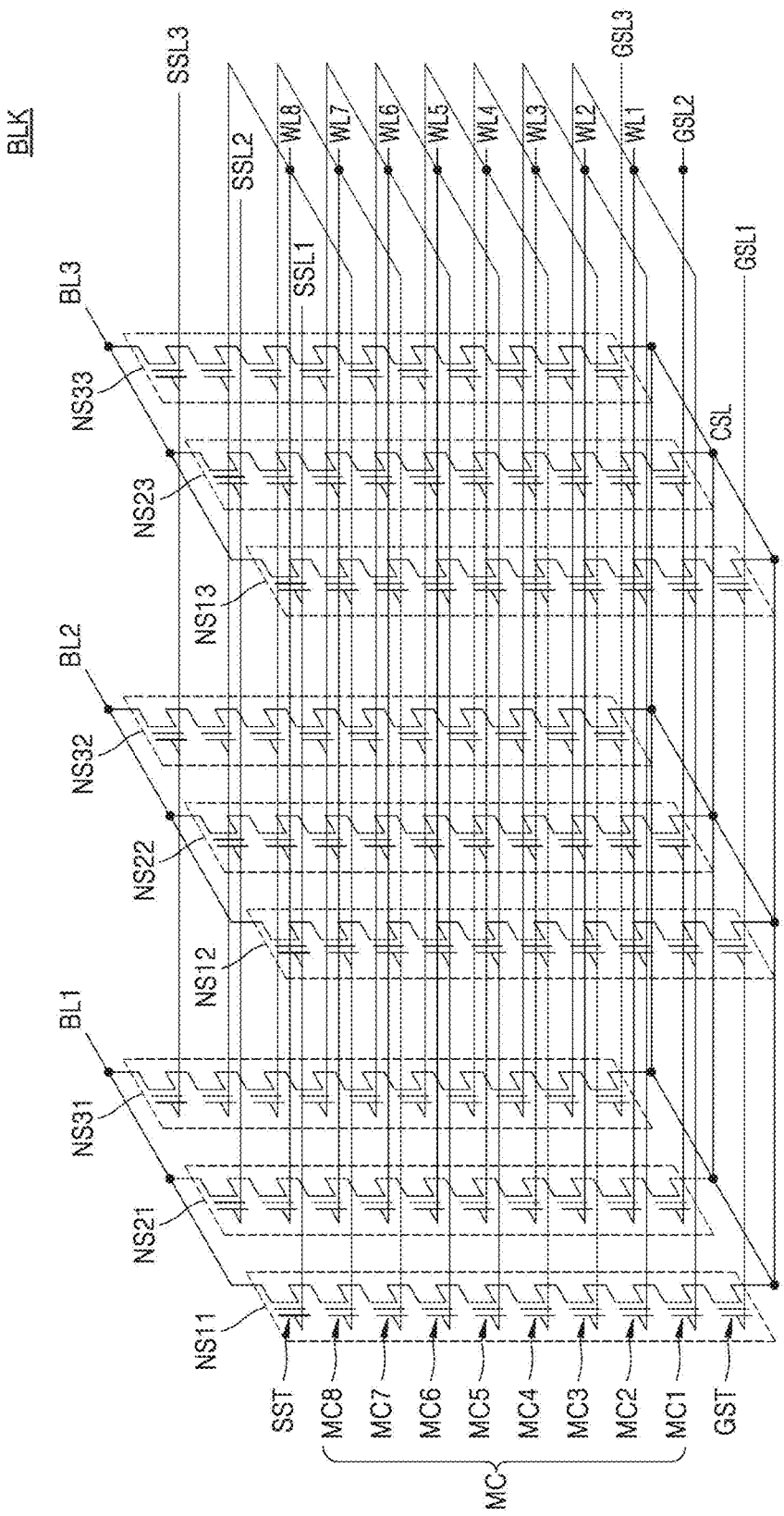

FIGS. 4A and 4B are circuit diagrams illustrating a memory block BLK of FIG. 3. FIG. 4A shows the memory block BLK implemented as a NAND flash memory having a two-dimensional horizontal structure. FIG. 4B shows the memory block BLK implemented as a NAND flash memory having a three-dimensional vertical structure.

Referring to FIG. 4A, memory cells MC may be two-dimensionally arranged on the same layer. The memory block BLK may include, for example, d (d is 2 or an integer more than 2) strings STRs in which eight memory cells MC are connected serially. Each string STR may include a string selection transistor SST and a ground selection transistor GST, which are connected to both ends of the connected memory cells MC. The number of strings STR, the number of word lines WL, and the number of bit lines BL may be variously changed according to some example embodiments. The memory cells MC connected to one word line (e.g., a fifth word line WL5) may correspond to one physical page. If the memory cell MC is a single level memory cell, one physical page may store one page data. When the memory cell MC is a multi-level memory cell, one physical page may store a plurality of portions of page data. For example, when the memory cell MC is a multi-level cell storing two bits of data, a Least Significant Bit (LSB) stored in the memory cells MC constituting one physical page, that is, the memory cells MC connected to one word line, may constitute a first type of page data, and a Most Significant Bit (MSB) stored in the memory cells MC may constitute a second type of page data. Accordingly, two portions of page data may be stored in the memory cells MC connected to one word line.

Referring to FIG. 4B, the memory block BLK may include a plurality of NAND cell strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. The number of cell strings, the number of word lines, the number of bit lines, the number of ground selection lines, and the number of string selection lines may be variously changed according to some example embodiments.

The cell strings NS21 and NS31 may be provided between the first bit line BL1 and the common source line CSL. The cell strings NS12, NS22 and NS32 may be provided between the second bit line BL2 and the common source line CSL. The cell strings NS13, NS23 and NS33 may be provided between the third bit line BL3 and the common source line CSL. Each cell string (e.g., NS11) may include a string selection transistor SST, a plurality of memory cells MC1 to MC8, and a ground selection transistor GST that are connected serially. In some example embodiments, dummy cells may be arranged between the string selection transistor SST, the plurality of memory cells MC1 to MC8, the ground selection transistor GST, and the plurality of memory cells MC1 to MC8.

The string selection lines SSL1 to SSL3 may be separated from each other. Gates of the string selection transistor SST may be connected to the corresponding string selection lines SSL1 to SSL3. The ground selection lines GSL1 to GSL3 may also be separated from each other. Gates of the ground selection transistors GST may be connected to the corresponding ground selection lines GSL1 to GSL3. In some example embodiments, the ground selection lines GSL1 to GSL3 may be connected to each other. The string selection transistor SST may be connected to the corresponding bit line BL1 to BL3. The ground selection transistor GST may be connected to the common source line CSL.

The plurality of memory cells MC1 to MC8 may be connected to the corresponding word lines WL1 to WL8, respectively. The memory cells MC located at the same height from a substrate (or the ground selection transistors GST) may be commonly connected to one word line. The memory cells MC located at different heights may be connected to the different word lines WL1 to WL8, respectively. For example, the first memory cells MC1 may be connected in common to the first word line WL1, and the second memory cells MC2 may be connected in common to the second word line WL2.

The memory cells MC connected to one word line and programmed simultaneously may be included in, for example, a cell string selected by the same string select line SSL. The memory cells MC connected to one word line may correspond to one physical page. For example, in FIG. 4B, the memory cells MC connected to the fourth word line WL4 may correspond to three physical pages.

As described above with reference to FIG. 4A, when the memory cell MC is a single level cell, one physical page may store one page data, and when the memory cell MC is a multi-level cell, one physical page may store a plurality of portions of page data. For example, when the memory cell MC is a multi-level cell storing two bits of data, six portions of page data may be stored in the memory cells MC of the fourth word line WL4.

Figure 5:
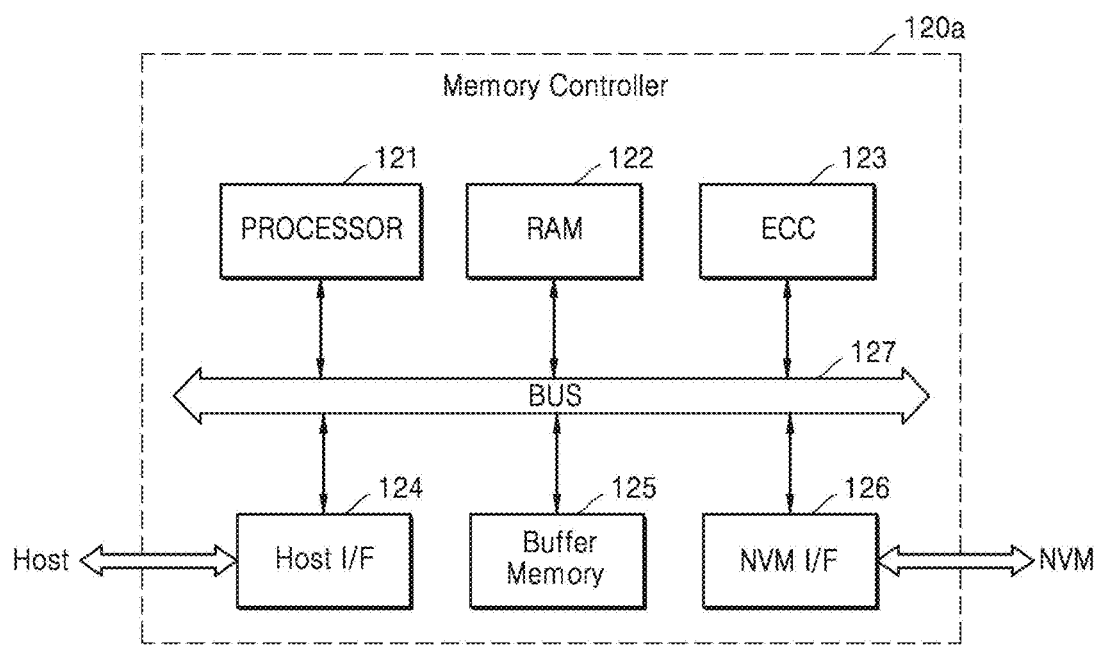
FIG. 5 is a block diagram illustrating an implementation example of a memory controller according to an example embodiment of some inventive concepts.

FIG. 5 is a block diagram illustrating an implementation example of a memory controller 120*a* according to some example embodiments of some inventive concepts.

Referring to FIG. 5, the memory controller 120*a* may include a processor 121, Random Access Memory (RAM) 122, an Error Correction Code (ECC) circuit 123, a host interface circuit 124, a buffer memory 125, and an NVM interface circuit 126. Elements of the memory controller 120*a*, for example, the processor 121, the RAM 122, the ECC circuit 123, the host interface circuit 124, the buffer memory 125, and the NVM interface circuit 126 may communicate with each other via a bus 127.

The processor 121 may include a CPU or a microprocessor and may control the overall operation of the memory controller 120a. In some example embodiments, the processor 121 may be implemented as a multi-core processor, for example, a dual core processor or a quad core processor.

The RAM 122 may store firmware and data for controlling the memory controller 120a. The stored firmware and data may be driven or processed by the processor 121.

A software layer structure of the memory controller 120a implemented as firmware may include a host interface layer, a Flash Translation Layer (FTL), a flash interface layer, and the like.

The processor 121 may control the host interface circuit 124 to receive data from the host and/or store the data in the buffer memory 125 by driving the host interface layer. The processor 121 may perform an address mapping operation between a logical address provided from the host and a physical address of the NVM 110 by driving the FTL and may perform a main operation of the NVM 110 of FIG. 1 such as garbage collection, bad block management, read reclaim, read replacement, etc. Also, the processor 121 may manage a write operation, a read operation, and/or an erase operation of the NVM 110 by driving the flash interface layer. For example, the processor 121 may control, based on the flash interface layer, the NVM interface circuit 126 to transmit command sets to the NVM 110, according to a multi-plane read operation according to some example embodiments of some inventive concepts.

The ECC circuit 123 may detect and/or correct an error included in the data received from the NVM 110.

The buffer memory 125 may store write data received from the host or read data read from the NVM 110. The buffer memory 125 may be implemented as a volatile memory such as dynamic random access memory (DRAM), static random access memory (SRAM), or the like. The buffer memory 125 may be implemented as various types of non-volatile memory such as resistive non-volatile memory, including (without limitation) magnetic RAM (MRAM), phase change RAM (RAM), or resistive RAM (ReRAM), flash memory, Nano Floating Gate Memory (NFGM), Polymer Random Access Memory (PoRAM), and Ferroelectric Random Access Memory (FRAM). In some example embodiments, the buffer memory 125 may be implemented as a separate memory device outside the memory controller 120a.

Figure 6:
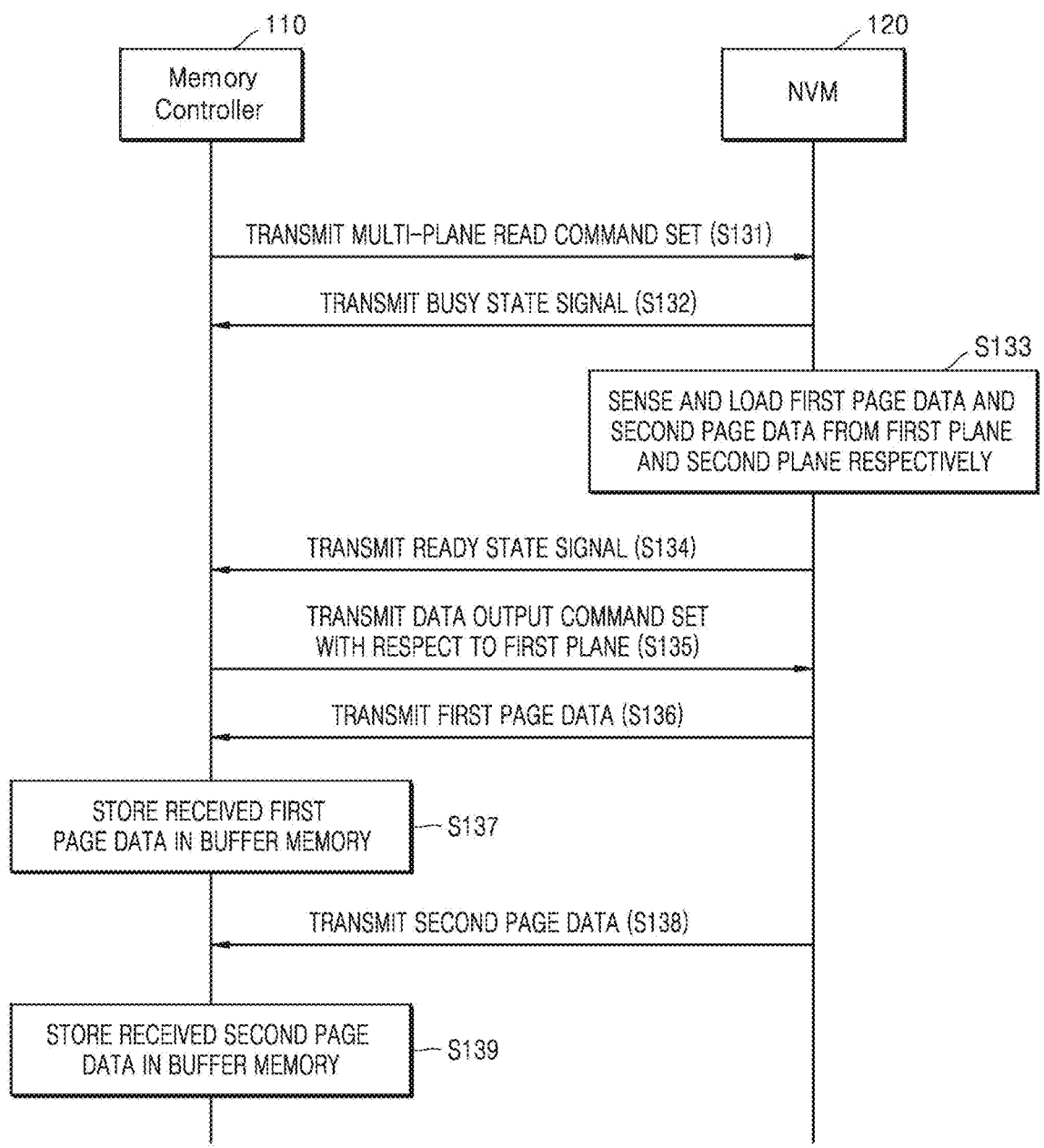
FIG. 6 is a flowchart illustrating a multi-plane read operation of a storage device according to an example embodiment of some inventive concepts.
Figure 7A:
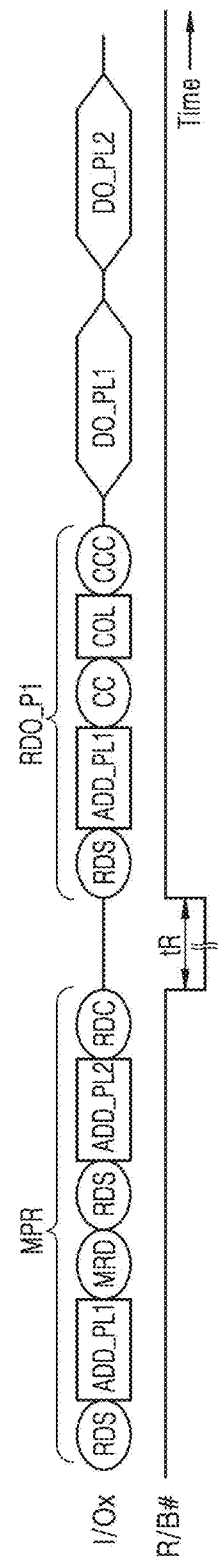
FIGS. 7A and 7B are diagrams for explaining a multi-plane read operation of a storage device according to an example embodiment of some inventive concepts.
Figure 7B:
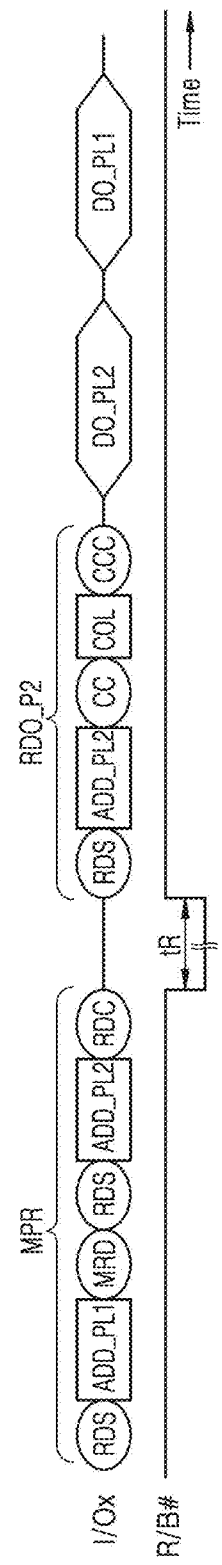

FIG. 6 is a flowchart illustrating a multi-plane read operation of a storage device according to some example embodiments of some inventive concepts. FIGS. 7A and 7B are diagrams for explaining the multi-plane read operation of the storage device according to some example embodiments of some inventive concepts. FIGS. 7A and 7B and similar following figures are presented as a horizontal timeline of the communication of instructions. Additionally, in FIGS. 7A and 7B and similar following figures, a circle denotes a command, such as may be transmitted by a memory controller 120 to non-volatile memory 110; a rectangle denotes a parameter, such as an address of a plane, page, or column; and a hexagon denotes an operation performed by the non-volatile memory 110.

The multi-plane read operation of the storage device according to an example embodiment of some inventive concepts in FIG. 6 is described with reference to FIGS. 7A and 7B. For convenience of description, it is assumed that the NVM 110 includes a first plane and a second plane, and the storage device performs a two-plane read operation.

The memory controller 120 may transmit a multi-plane read command set MPR to the NVM 110 (S131). For example, as shown in FIGS. 7A and 7B, the multi-plane read command set MPR may include a read command RDS, an address of the first plane ADD_PL1, a multi-plane read command MRD, an address of the second plane ADD_PL2, and a read confirm command RDC. The memory controller 120 may transmit the multi-plane read command set MPR to the NVM 110 via an input/output bus I/Ox between the NVMs 110. In some example embodiments, the read command RDS may be a standard read command, for example, 00h (i.e., hex code '00') and may indicate the beginning of a read sequence. The multi-plane read command MRD is a command indicating that reading of a multi-plane is performed simultaneously, and may be, for example, 32h. The read confirm command RDC is a command indicating the end of the read sequence, that is, the end of a read command set, and may be, for example, 30h. The addresses of the first and second planes ADD_P1 and ADD_P2 may include a row address and a column address for the first and second planes, respectively. In some example embodiments, the memory controller 120 may send each of the commands to the NVM 110 for one write cycle, and addresses may be transmitted for each command to the NVM 110 during a plurality of write cycles. For example, the row address may be transmitted for two write cycles, and the column address may be transmitted for three write cycles. In this example, the write cycle represents a rising or polling cycle of the write enable signal provided by the memory controller 120 to the NVM 110.

The NVM 110 may select a plane, a memory block, and/or a page based on an address. When a memory cell is a multi-level cell, the page may include a physical page and a logical page, for example, a page according to a type of page data (e.g., MSB page data, LSB page data, etc.)

In some example embodiments, the address of the first plane ADD_P1 and the address of the second plane ADD_PL2 may correspond to the same page (e.g., a first page PG1 of the first plane and also a first page PG1 of the second plane). Data sensing for the corresponding pages is performed in the first plane and the second plane, where data sensing conditions (for example, a read voltage, the number of times of reading, and the like) may be the same or similar, such that a period of time for data sensing of the first plane and a period of time for data sensing of the second plane may be the same or similar.

When reception of the multi-plane read command set MPR is completed, the NVM 110 may transmit a busy state signal to the memory controller 120 (S132). For example, as shown in FIGS. 7A and 7B, the NVM 110 may set the state signal R/B # to a logical low level, thereby generating the busy state signal indicating a state in which commands, addresses, and/or data may not be transmitted and/or received.

First page data and second page data may be sensed and loaded from the first plane and the second plane, respectively (S133). For example, as shown in FIGS. 7A and 7B, the first page data stored in the first plane may be loaded into a first page buffer of the first plane and the second page data stored in the second plane may be loaded into a second page buffer during a tR period.

When loading of the page data is completed, the NVM 110 may transmit a ready state signal to the memory controller 120 (S134). The NVM 110 may set the state signal R/B # to a logical high level, thereby transmitting the ready state signal indicating a state in which commands, addresses, or data may be transmitted and/or received.

In some example embodiments, the memory controller 120 may transmit a data output command set for the first plane RDO_P1 to the NVM 110 (S135). For example, as shown in FIG. 7A, the data output command set for the first plane RDO_P1 may include the read command RDS, the address of the first plane ADD_PL1, a choose column command CC, a column address COL, and a choose column confirm command CCC. The choose column command CC is a command indicating choice of a column of the page buffer, and may be, for example, 05h or 06h. The column address COL may indicate a position of a column where data to be output is located on the page buffer. The choose column confirm command CCC is a command indicating the end of the data output command set, and may be, for example, E0h.

In some example embodiments, the NVM 110 may transmit the first page data of the first plane to the memory controller 120 based on the data output command set for the first plane RDO_P1 (S136). Referring to FIG. 7A, the NVM 110 may output the first page data to the memory controller 120 via the input/output bus I/Ox (DO_PL1). As described above with reference to FIG. 3, the NVM 110 may output data to the memory controller 120 in units of one byte or two bytes. For example, when one page is 16 KB (kilobytes), page data may be continuously output in units of one byte for about 16000 read cycles. In this example, the read cycle represents a rising or polling cycle of the read enable signal provided by the memory controller 120 to the NVM 110.

In some example embodiments, the NVM 110 may, based on the choose column command CC and the column address COL of the data output command set for the first plane RDO_P1, select a column at which data to be output is located on the first page buffer and output data from the selected column to a last column on the first page buffer. In other words, the NVM 110 may output at least a portion of the first page data based on the choose column command CC and the column address COL. The memory controller 120 may store the received first page data in the buffer memory 125 (FIG. 1) (S137).

In some example embodiments, when output of the first page data is completed, the NVM 110 may transmit the second page data of the second plane to the memory controller 120 (S138). The NVM 110 may change a plane from which data is to be output when the output of the first page data is completed. The NVM 110 may change the plane from which data is to be output from the first plane to the second plane and output the second page data loaded in a second page buffer of the second plane to the memory controller 120 via the input/output bus I/Ox (DO_PL2), and then all of the second page data may be output. The memory controller 120 may store the received second page data in the buffer memory 125 (S139). Therefore, the multi-plane read operation may be completed.

In some example embodiments, as shown in FIG. 7B, the memory controller 120 may transmit the data output command set for the second plane RDO_P2 to the NVM 110. The data output command set for the second plane RDO_P2 may include the read command RDS, the address of the second plane ADD_PL2, the choose column command CC, the column address COL, and the choose column confirm command CCC.

Based on the data output command set for the second plane RDO_P2, the NVM 110 may transmit at least a portion of the second page data loaded in the second page buffer of the second plane to the memory controller 120 via the input/output bus I/Ox (DO_PL2). When output of the second page data is completed, the plane on which data is to be output may be changed from the second plane to the first plane. The first page data loaded in the first page buffer of the first plane may be output to the memory controller 120 via the input/output bus I/Ox (DO_PL2), and then all of the first page data may be output.

Figure 8:
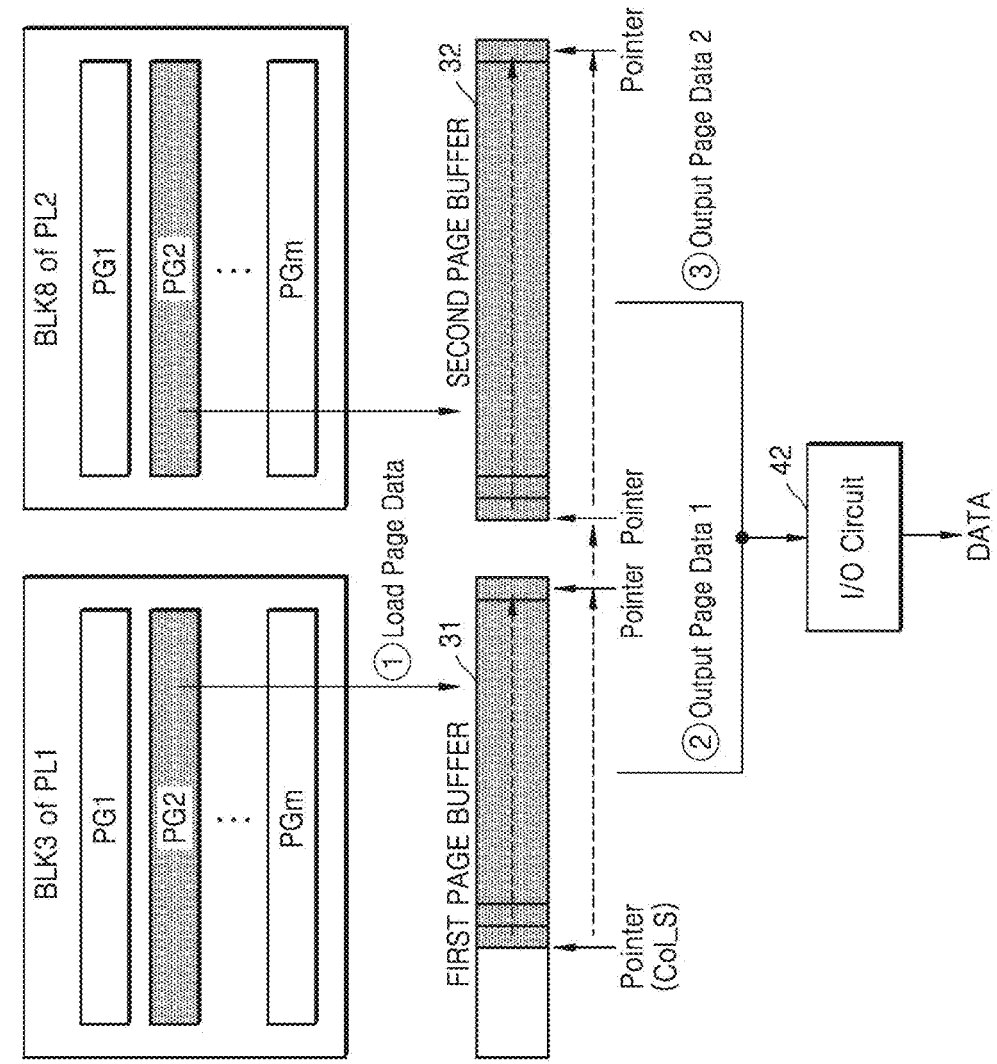
FIG. 8 is a diagram illustrating an example of an operation of a non-volatile memory based on performing of a multi-plane read operation according to an example embodiment of some inventive concepts.

FIG. 8 is a diagram illustrating an example of an operation of a non-volatile memory based on performing of a multi-plane read operation according to an example embodiment of some inventive concepts. FIG. 8 is described with reference to FIG. 7A.

Based on the multi-plane read command set MPR, first page data stored in a second page PG2 of the third memory block BLK3 of the first plane PL1 may be loaded into the first page buffer 31 connected to the first plane PL1, and second page data stored in the second page PG2 of the eighth memory block BLK8 of the second plane PL2 may be loaded into the second page buffer 32 connected to the second plane PL2 (①). The first page data and the second page data may be simultaneously loaded into the first page buffer 31 and the second page buffer 32, respectively.

Based on the address ADD_PL1 of the first plane PL1 included in the data output command set RDO_P1 for the first plane PL1, a plane from which data is to be output may be determined as the first plane PL1, and a pointer may instruct a column, for example, a start column Col_S, on the first page buffer 31 in which output of the data will start based on the column COL. The pointer may be shifted from the start column Col_S to a last column, and accordingly at least a portion of the first page data from data of the start column Col_S to data of the last column may be output through the input/output circuit 42 (②). Thereafter, the plane from which data is to be output may be changed from the first plane PL1 to the second plane PL2. The pointer may instruct a first column of the second page buffer 32 and may be shifted from the first column to the last column of the second page buffer 32. Accordingly, all of the second page data may be output through the input/output circuit 42 (③).

Figure 9:
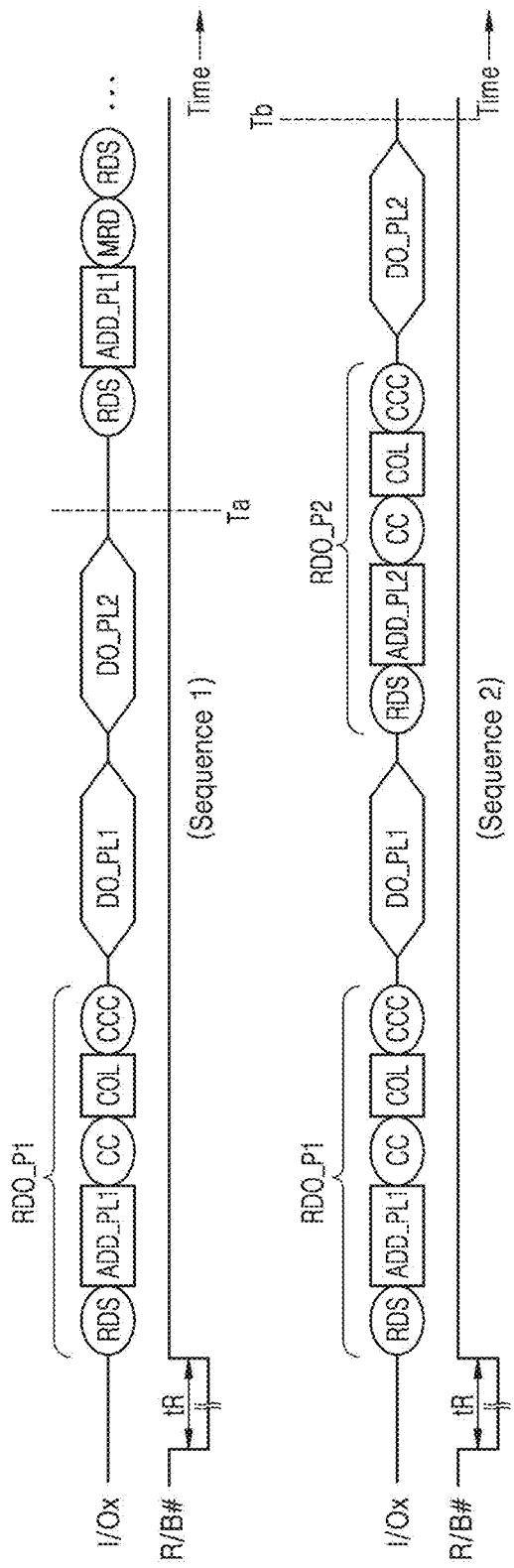
FIG. 9 is a diagram comparing a multi-plane read operation according to an example embodiment of some inventive concepts to a multi-plane read operation according to a comparative example.

FIG. 9 is a diagram comparing a multi-plane read operation according to an example embodiment of some inventive concepts to a multi-plane read operation according to a comparative example.

Referring to FIG. 9, a first sequence represents a command set sequence for performing the multi-plane read operation according to an example embodiment of some inventive concepts, and a second sequence represents a command set sequence for performing the multi-plane read operation according to the comparative example. An operation of receiving a multi-plane read command set, that is, an operation before the tR period, are omitted.

According to the first sequence according to some example embodiments of some inventive concepts, as described above, data of a first plane (e.g., first page data) may be output (DO_PL1) based on the data output command set for the first plane RDO_P1, and data of the second plane (e.g., second page data) may be output immediately (DO_PL2). Accordingly, the multi-plane read operation may be terminated at a Ta point. Thereafter, another read operation, such as a multi-plane read operation or a standard read operation, may be performed.

However, according to the second sequence according to the comparative example, the data of the first plane may be output (DO_PL1) based on the data output command set for the first plane RDO_P1, and thereafter, when the memory controller 120 transmits the data output command set for the second plane RDO_P2 to the NVM 110, the NVM 110 may output the data of the second plane based on the data output command set for the second plane RDO_P2 (DO_PL2). Accordingly, the multi-plane read operation may be terminated at a Tb time.

As above, according to the second sequence according to the comparative example, to changing a plane from which data is to be output often involves a period of time or delay in which a data output command set for each of a plurality of planes is received, that is, a period of time or a delay for completing a plane change. However, according to the first sequence according to some example embodiments of some inventive concepts, the period of time or delay for the plane change may be reduced.

Figure 10A:
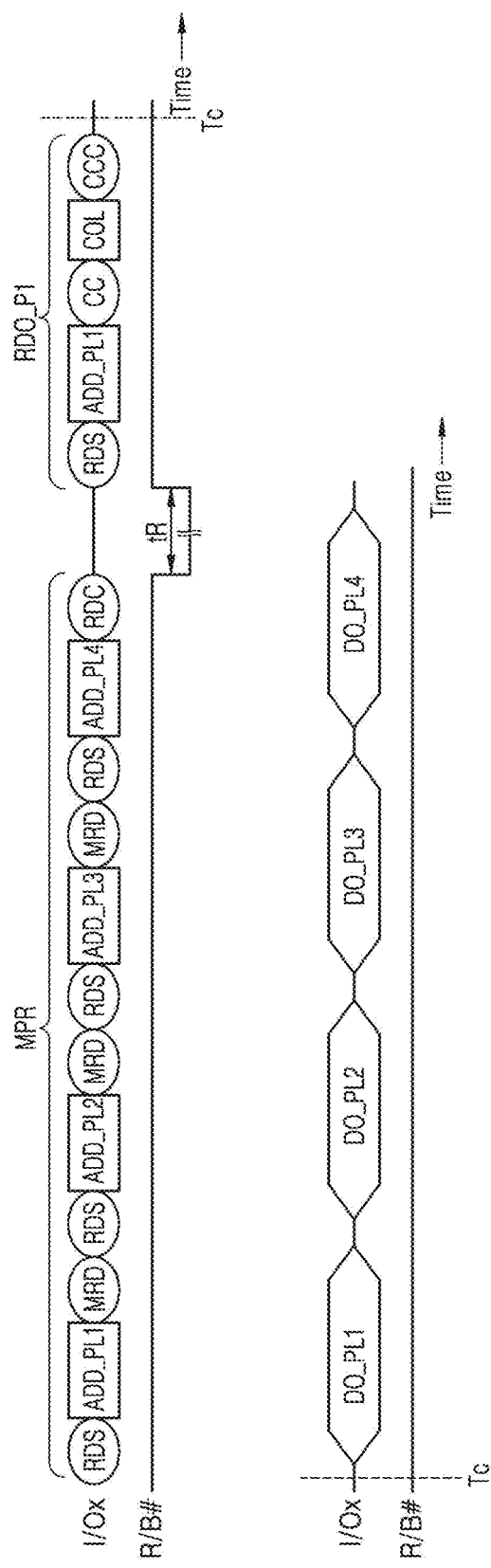
FIGS. 10A, 10B and 10C are diagrams for explaining a multi-plane read operation of a storage device according to an example embodiment of some inventive concepts.
Figure 10B:
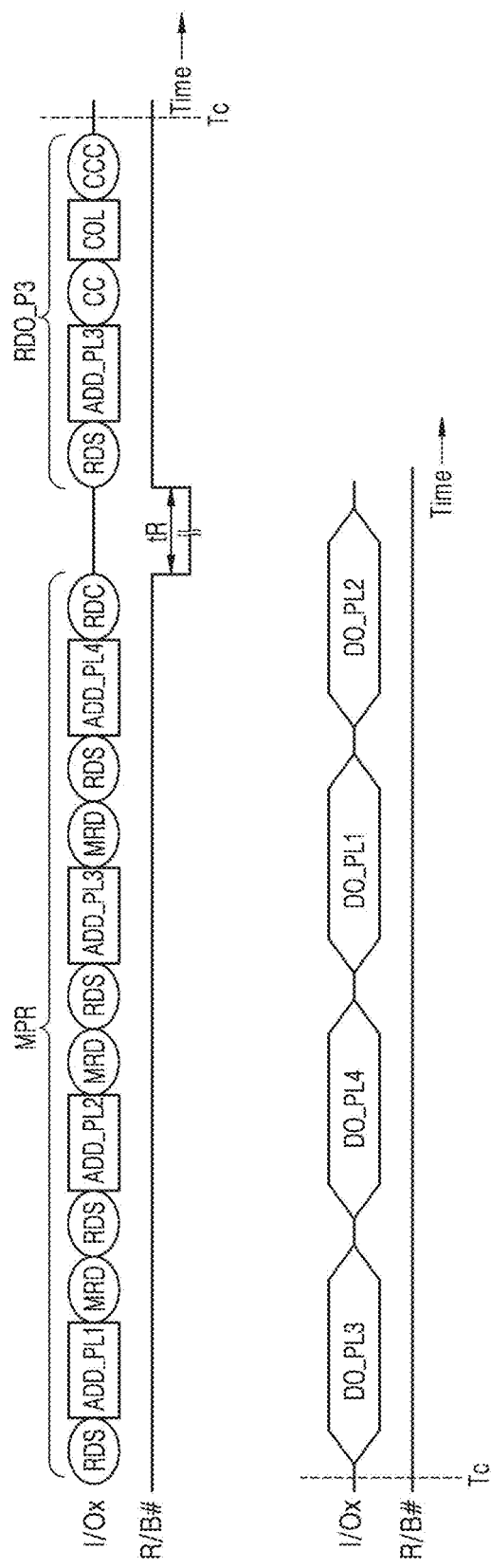
Figure 10C:
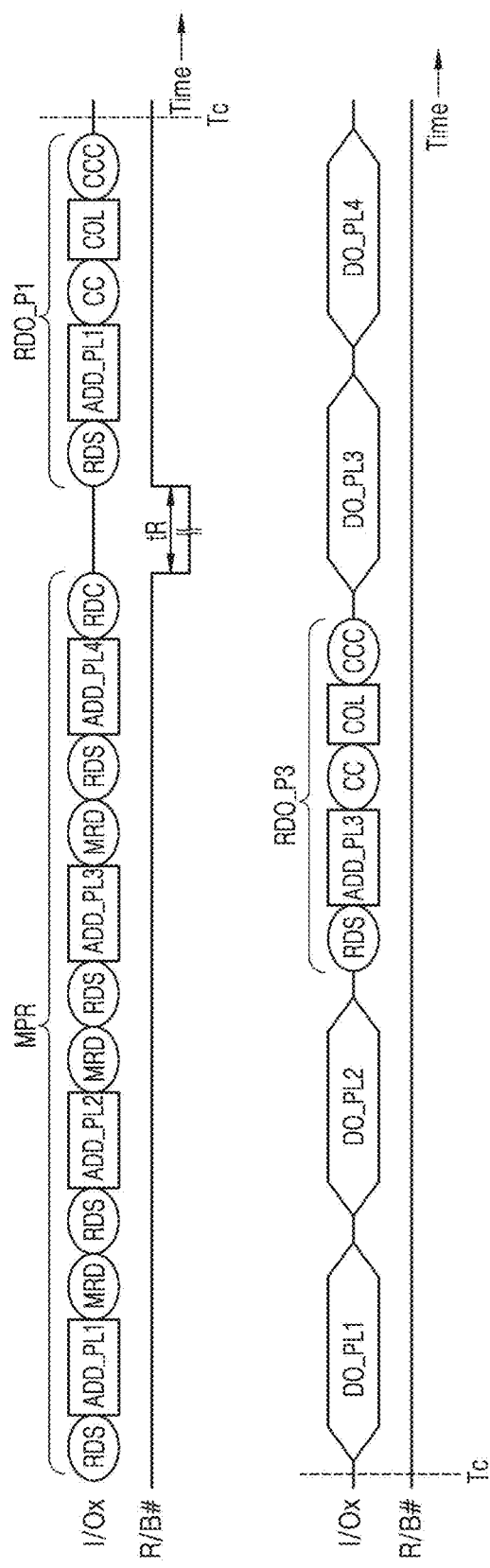

FIGS. 10A, 10B and 10C are diagrams for explaining a multi-plane read operation of a storage device according to some example embodiments of some inventive concepts. In FIGS. 10A 10B and 10C, it is assumed that the NVM 110 includes the first to fourth planes PL1 to PL4, and the storage device performs the multi-plane read operation with respect to a 4-plane.

Referring to FIG. 10A, the memory controller 120 may transmit the multi-plane read command set MPR indicating the multi-plane read operation for the 4-plane to the NVM 110. The multi-plane read command set MPR may include the read command RDS, the address of a first plane ADD_PL1, the multi-plane read command MRD, the read command RDS, the address of a second plane ADD_PL2, the multi-plane read command MRD, the read command RDS, an address of a third plane ADD_PL3, the multi-plane read command MRD, the read command RDS, an address of a fourth plane ADD_PL4, and the read confirm command RDC.

When reception of the multi-plane read command set MPR is completed, the NVM 110 may transmit a busy state signal to the memory controller 120 by setting the state signal R/B # to a logical low level. In the NVM 110, during the tR period, first to fourth page data stored in the first to fourth planes PL1 to PL4 may be simultaneously loaded into first to fourth page buffers, respectively. The first to fourth page buffers may be connected to the first to fourth planes PL1 to PL4, respectively.

When loading of the page data is completed, the NVM 110 may transmit a ready state signal to the memory controller 120 by setting the state signal R/B # to a logical high level. The memory controller 120 may transmit the data output command set RDO_P1 for the first plane PL1 to the NVM 110, and the NVM 110 may output the first page data of the first plane PL1 to the memory controller 120 (DO_PL1) based on the data output command set RDO_P1 for the first plane PL1. When output of the first page data is completed, the NVM 110 may change a plane from which data is to be output from the first plane PL1 to the second plane PL2 and output the second page data of the second plane PL2 to the memory controller 120 (DO_PL2). When output of the second page data is completed, the NVM 110 may change the plane from which data is to be output from the second plane PL2 to the third plane PL3 and output the third page data of the third plane PL3 to the memory controller 120 (DO_PL3). When output of the third page data is completed, the NVM 110 may change the plane from which data is to be output from the third plane PL3 to the fourth plane PL4 and output the fourth page data of the fourth plane PL4 to the memory controller 120 (DO_PL4). Therefore, the multi-plane read operation for the 4-plane may be completed.

Referring to FIG. 10B, after loading of the page data is completed, the memory controller 120 may transmit a data output command set RDO_P3 for the third plane PL3 to the NVM 110, and the NVM 110 may output the third page data of the third plane PL3 to the memory controller 120 (DO_PL3) based on the data output command set RDO_P3 for the third plane PL3. Thereafter, the NVM 110 may sequentially output the fourth page data of the fourth plane PL4, the first page data of the first plane PL1, and the second page data of the second plane PL2 to the memory controller 120 by sequentially changing planes from which data is to be output. In FIG. 10B, the planes from which data is to be output are changed in the order of the fourth plane PL4, the first plane PL1, and the second plane PL2 after the third plane PL3, but that some example embodiments are not limited thereto. After the page data from the plane corresponding to the received data output command set is output, a sequence of the plane change may occur.

Referring to FIG. 10C, after the loading of the page data is completed, the memory controller 120 may transmit the data output command set RDO_P1 for the first plane PL1 to the NVM 110, and the NVM 110 may output the first page data of the first plane PL1 to the memory controller 120 (DO_PL1) based on the data output command set RDO_P1 for the first plane PL1. Then, the NVM 110 may change the plane from which data is output from the first plane PL1 to the second plane PL2 and output the second page data of the second plane PL2 to the memory controller 120 (DO_PL2).

On the other hand, the memory controller 120 may transmit the data output command set RDO_P3 for the third plane PL3 (or the fourth plane PL4) to the NVM 110 after the second page data is received. The NVM 110 may output the third page data of the third plane PL3 to the memory controller 120 (DO_PL3) based on the data output command set RDO_P3 for the third plane PL3. Thereafter, the NVM 110 may change the plane from which data is output from the third plane PL3 to the fourth plane PL4 and output the fourth page data of the fourth plane PL4 to the memory controller 120 (DO_PL4).

Figure 11:
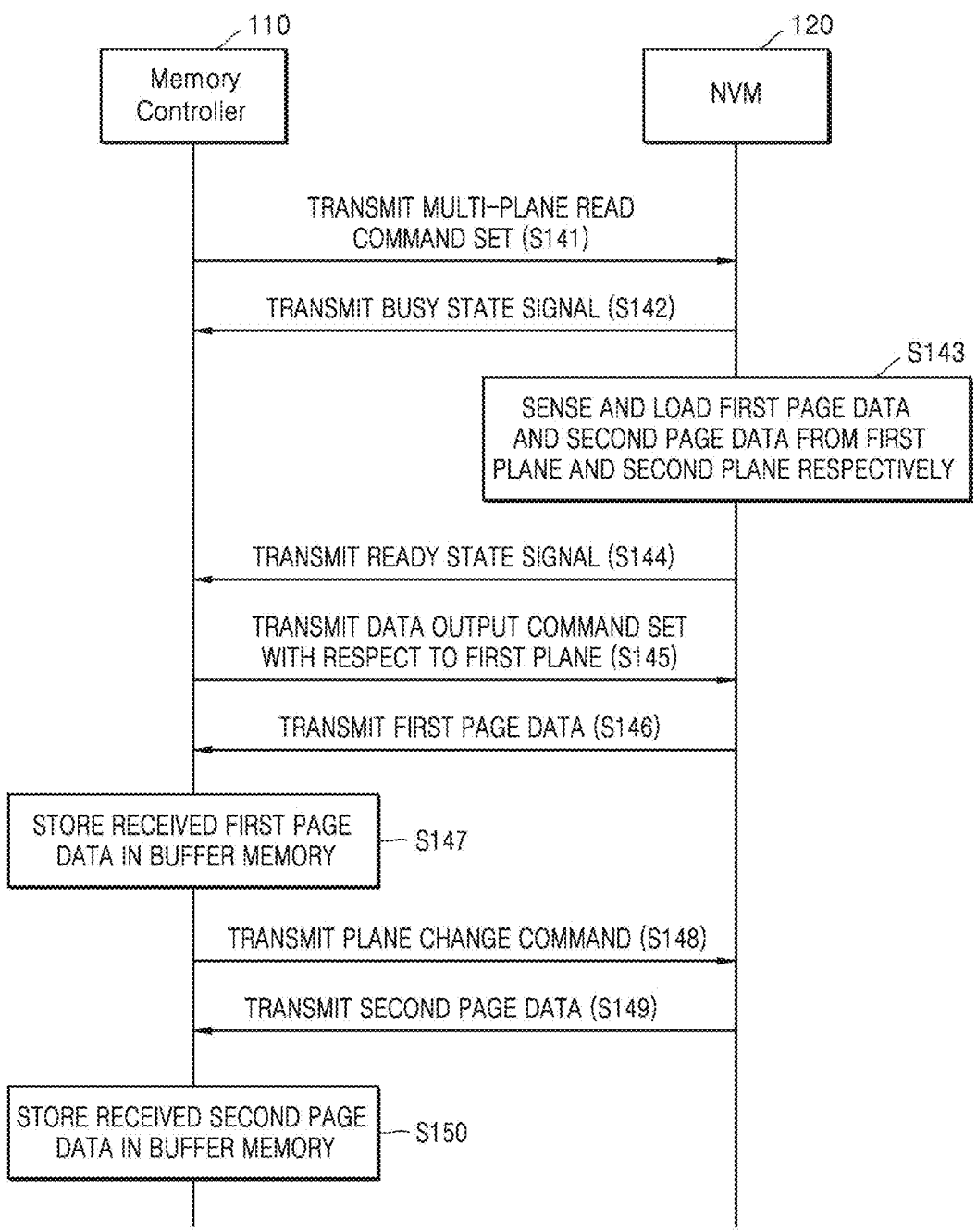
FIG. 11 is a flowchart illustrating a multi-plane read operation of a storage device according to an example embodiment of some inventive concepts.
Figure 12:
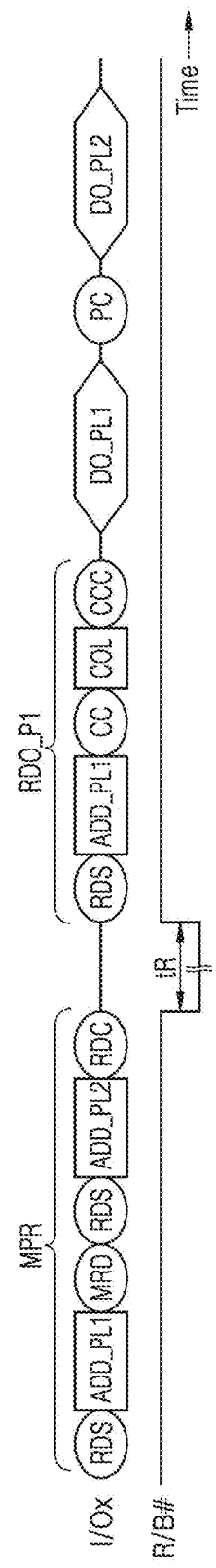
FIG. 12 is a diagram for explaining a multi-plane read operation of a storage device according to an example embodiment of some inventive concepts.

FIG. 11 is a flowchart illustrating a multi-plane read operation of a storage device according to some example embodiments of some inventive concepts. FIG. 12 is a diagram for explaining a multi-plane read operation of a storage device according to some example embodiments of some inventive concepts.

The multi-plane read operation of the storage device according to an example embodiment of some inventive concepts in FIG. 11 is described with reference to FIG. 12. For convenience of description, it is assumed that the NVM 110 includes a first plane and a second plane and the storage device performs a two-plane read operation.

Referring to FIGS. 11 and 12, the memory controller 120 may transmit the multi-plane read command set MPR to the NVM 110 (S141). When reception of the multi-plane read command set is completed, the NVM 110 may transmit a busy state signal, for example, the state signal R/B # of a logical low level, to the memory controller 120 (S142), and sense and load first page data and second page data from the first plane and the second plane, respectively during the tR period (S143).

When loading of the page data is completed, the NVM 110 may transmit a ready state signal, for example, the state signal R/B # of a logical high level, to the memory controller 120 (S144). The memory controller 120 may transmit the data output command set for the first plane RDO_P1 to the NVM 110 (S145).

The memory controller 120 may transmit the first page data of the first plane to the memory controller 120 (S146). The NVM 110 may output the first page data to the memory controller 120 (DO_PL1) based on the data output command set for the first plane RDO_P1.

The memory controller 120 may store the received first page data in the buffer memory 125 (FIG. 1) (S147). Operations S141 to S147 respectively may be the same as or similar to operations S141 to S137 described with reference to FIG. 6, and thus detailed descriptions thereof are omitted.

In some example embodiments, the memory controller 120 may transmit a plane change command (PC) for a plane change to a non-volatile memory 148. The plane change command PC is a command for instructing the plane change of output data and may be, for example, 3Bh. Unlike the data output command set, the plane change command PC may not include an address and/or a column address of a plane to be changed, and a period of time or delay for transmitting the plane change command PC may be very short. For example, the memory controller 120 may transmit the plane change command PC to the NVM 110 during one write cycle.

The NVM 110 may transmit second page data of the second plane to the memory controller 120 based on the received plane change command PC (S149). The NVM 110 may change the plane from which data is to be output from the first plane to the second plane and output the second page data of the second plane based on the received plane change command PC (DO_PL2).

The memory controller 120 may store the received second page data in the buffer memory 125 (S150). Therefore, the multi-plane read operation may be completed.

Figure 13:
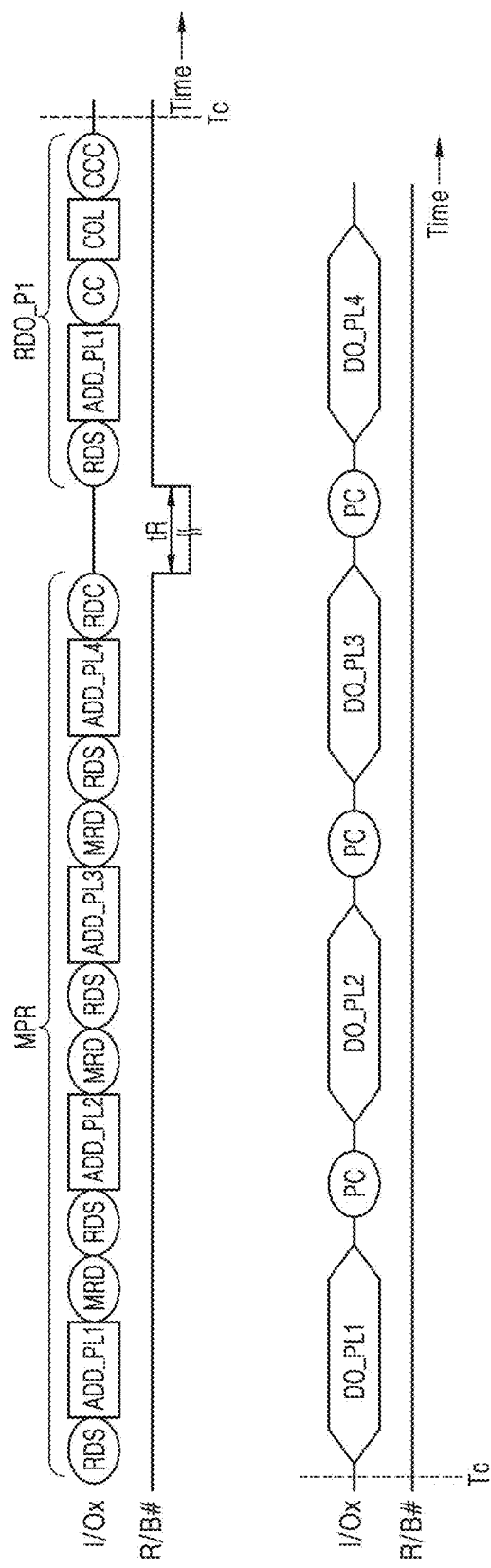
FIG. 13 is a diagram for explaining a multi-plane read operation of a storage device according to an example embodiment of some inventive concepts.

FIG. 13 is a diagram for explaining a multi-plane read operation of a storage device according to an example embodiment of some inventive concepts. In FIG. 13, it is assumed that the NVM 110 includes the first to fourth planes PL1 to PL4 and the storage device performs the multi-plane read operation with respect to a 4-plane.

Referring to FIG. 13, the memory controller 120 may transmit the multi-plane read command set MPR indicating the multi-plane read operation for the 4-plane to the NVM 110.

The NVM 110 may transmit a busy state signal to the memory controller 120 by setting the state signal R/B # to a logical low level when reception of the multi-plane read command set MPR is completed. In the NVM 110, during the tR period, first to fourth page data stored in the first to fourth planes PL1 to PL4 may be simultaneously loaded into the first to fourth page buffers, respectively.

When loading of the page data is completed, the NVM 110 may transmit a ready state signal to the memory controller 120 by setting the state signal R/B # to a logical high level. The memory controller 120 may transmit the data output command set RDO_P1 for the first plane PL1 to the NVM 110, and the NVM 110 may output the first page data of the first plane PL1 to the memory controller 120 (DO_PL1) based on the data output command set RDO_P1 for the first plane PL1.

When the first page data is received, the memory controller 120 may transmit the plane change command PC to the NVM 110. The NVM 110 may change a plane from which data is to be output from the first plane PL1 to the second plane PL2 based on the plane change command PC and output the second page data of the second plane PL2 to the memory controller 120 (DO_PL2).

When the second page data is received, the memory controller 120 may transmit the plane change command PC to the NVM 110. The NVM 110 may change the plane from which data is to be output from the second plane P12 to the third plane P13 based on the plane change command PC and output the third page data of the third plane PL3 to the memory controller 120 (DO_PL3).

When the third page data is received, the memory controller 120 may transmit the plane change command PC to the NVM 110. The NVM 110 may change the plane from which data is to be output from the third plane PL3 to the fourth plane PL4 based on the plane change command PC and output the fourth page data of the fourth plane PL4 to the memory controller 120 (DO_PL4).

As described above, according to some example embodiments, when page data of one plane is received, the memory controller 120 may transmit the plane change command PC to the NVM 110, and the NVM 110 may output page data of a plurality of planes by changing the plane from which data is to be output based on the plane change command PC.

On the other hand, in other example embodiments, after the first page data is output, the NVM 110 changes the plane from which data is to be output in the order of the second plane PL2, the third plane PL3, and the fourth plane PL4 based on the plane change command PC, but is not limited thereto. A sequence in which planes are changed based on the plane change command PC may be variously set.

Figure 14:
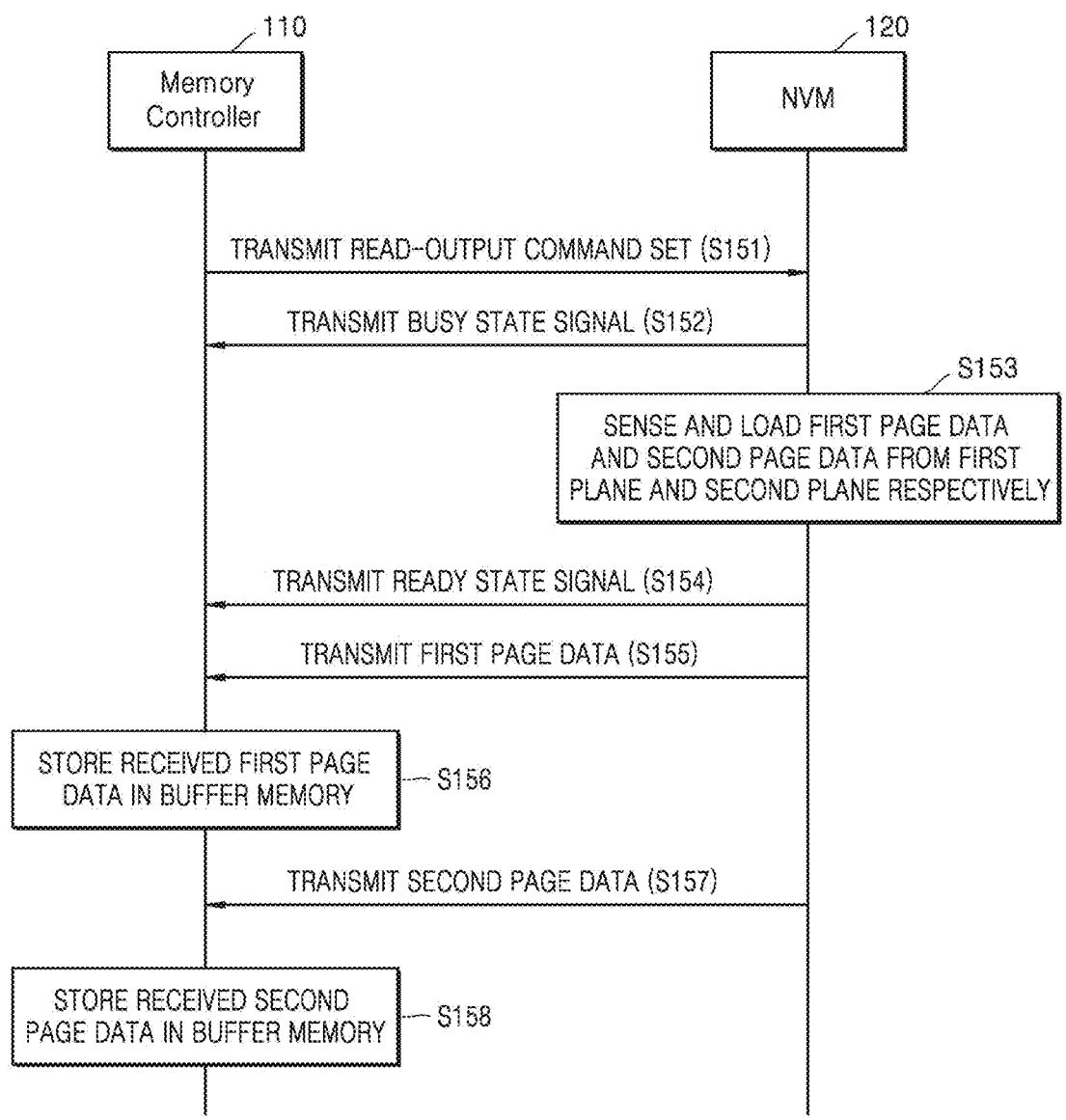
FIG. 14 is a flowchart showing a multi-plane read operation of a storage device according to an example embodiment of some inventive concepts.
Figure 15:
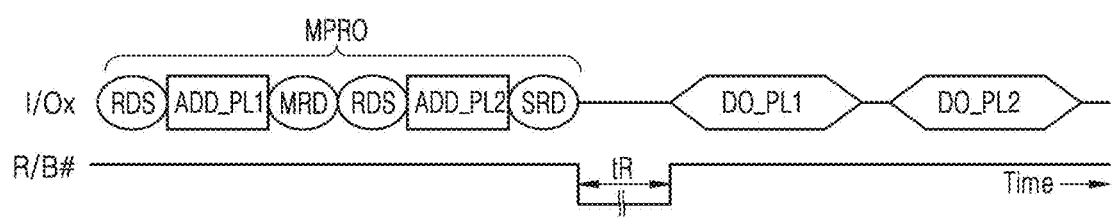
FIG. 15 is a diagram for explaining a multi-plane read operation of a storage device according to an example embodiment of some inventive concepts.

FIG. 14 is a flowchart showing a multi-plane read operation of a storage device according to some example embodiments of some inventive concepts. FIG. 15 is a diagram for explaining a multi-plane read operation of a storage device according to some example embodiments of some inventive concepts.

The multi-plane read operation of the storage device according to an example embodiment of FIG. 14 is described with reference to FIG. 15. For convenience of description, it is assumed that the NVM 110 includes a first plane and a second plane, and the storage device performs a two-plane read operation.

Referring to FIGS. 14 and 15, the memory controller 120 may transmit a read-output command set MPRO to the NVM 110 (S151). For example, as shown in FIG. 15, the read-output command set MPRO may include the read command RDS, the address of the first plane ADD_PL1, the multi-plane read command MRD, the read command RDS, the address of the second plane ADD_PL2, and a sequential read command SRD. The sequential read command SRD is a command indicating the end of the read-output command set MPRO and successive output of all of sensed page data of a multi-plane, and may be, for example, 3Ah. The memory controller 120 may transmit the sequential read command SRD to the NVM 110 during one cycle of a write cycle.

When reception of the read-output command set MPRO is completed, the NVM 110 may transmit the busy state signal, for example, the state signal R/B # of a logical low level, to the memory controller 120 (S152), and sense and load first page data and second page data from the first plane and the second plane, respectively during the tR period (S153).

When loading of the page data is completed, the NVM 110 may transmit the ready state signal, for example, the state signal R/B # of a logical high level to the memory controller 120 (S154).

Then, the NVM 110 may transmit the first page data to the memory controller 120 (S155). The NVM 110 may output the first page data to the memory controller 120 based on the sequential read command SRD of the read-output command set MPRO rather than a data output command set for the first plane or the second plane (e.g., without awaiting and/or receiving the data output command set for the first plane or the second plane RDO_P1 or RDO_P2 (DO_PL1)). The memory controller 120 may store the received first page data in the buffer memory 125 (FIG. 1) (S156).

Then, the NVM 110 may transmit the second page data of the second plane to the memory controller 120 (S157). The NVM 110 may change a plane from which data is to be output from the first plane to the second plane after the first page data is output based on the sequential read command SRD of the read-output command set MPRO, and may output the second page data of the second plane (DO_PL2).

The memory controller 120 may store the received second page data in the buffer memory 125 (S158). Thereby, the multi-plane read operation may be completed.

On the other hand, although the multi-plane read operation with respect to the 2-plane is described in some example embodiments, the multi-plane read operation according to other example embodiments may be applied to the 4-plane or a 6-plane. For example, when the read-output command set MPRO for a 4-plane including the sequential read command SRD is received, the NVM 110 may load four page data stored in each of four planes into a page buffer and then continuously output the four page data.

Figure 16:
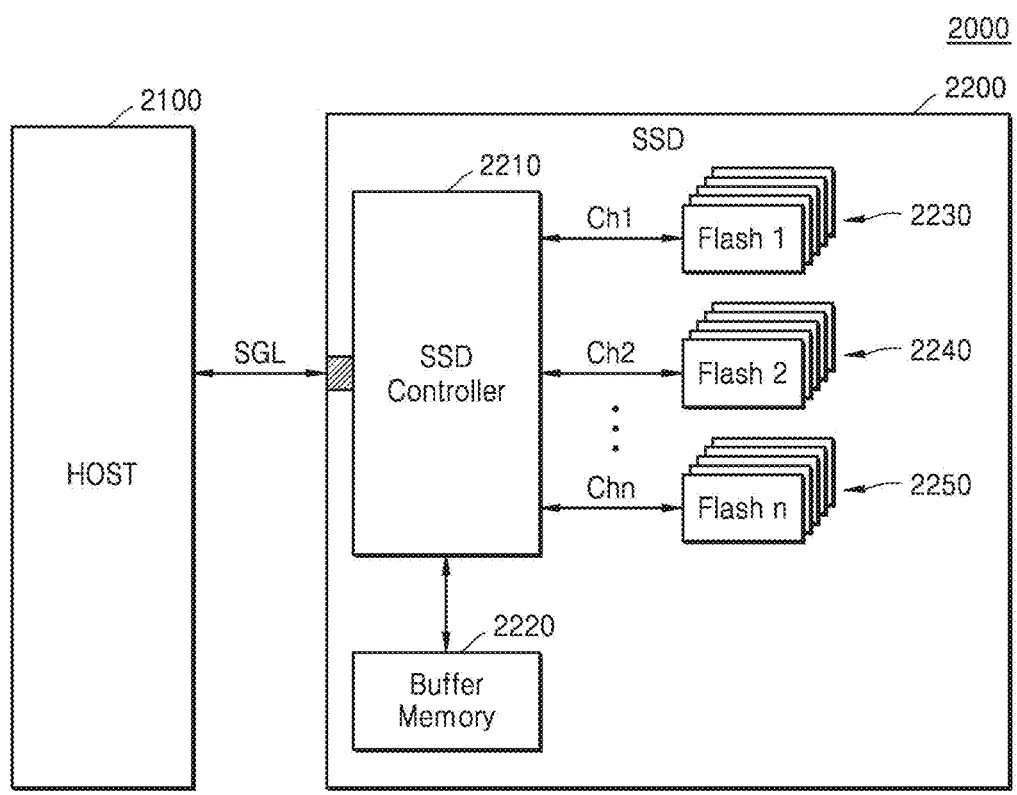
FIG. 16 is a block diagram illustrating an Solid state Drive (SSD) according to an example embodiment of some inventive concepts.

FIG. 16 is a block diagram illustrating an SSD 2200 according to an example embodiment of some inventive concepts.

Referring to FIG. 16, an SSD system 2000 may include a host 2100 and the SSD 2200. The SSD 2200 may transmit and receive signals to and from the host 2100 via a signal connector SGL. The SSD 2200 may also receive power from the host 2100 via a power connector.

The SSD 2200 may include an SSD controller 2210, a buffer memory 2220 and a plurality of memory devices 2230, 2240 and 2250. In this case, the SSD 2200 may be implemented using some example embodiments, such as those shown in FIGS. 1-15.

Specifically, the storage device 100 of FIG. 1 may be applied as the SSD 2200. The SSD controller 2210 may communicate with the plurality of memory devices 2230, 2240, and 2250. The SSD controller 2210 may temporarily store data read from the plurality of memory devices 2230, 2240, and 2250 (e.g., multi-plane page data) in the buffer memory 2220, and then transmit the data to the host 2100. Also, the SSD controller 2210 may temporarily store the data received by the host 2100 (e.g., write data) in the buffer memory 2220, and then transmit the data to at least one of the plurality of memory devices 2230, 2240, and 2250.

The storage device according to some example embodiments of some inventive concepts described above may be mounted or applied not only to the SSD system 2000 but also to a memory card system, a computing system, a UFS, and the like. Also, the method of the multi-plane read operation of the storage device according to some example embodiments of some inventive concepts may be applied to various kinds of electronic systems on which a non-volatile memory is mounted.

Figure 17:
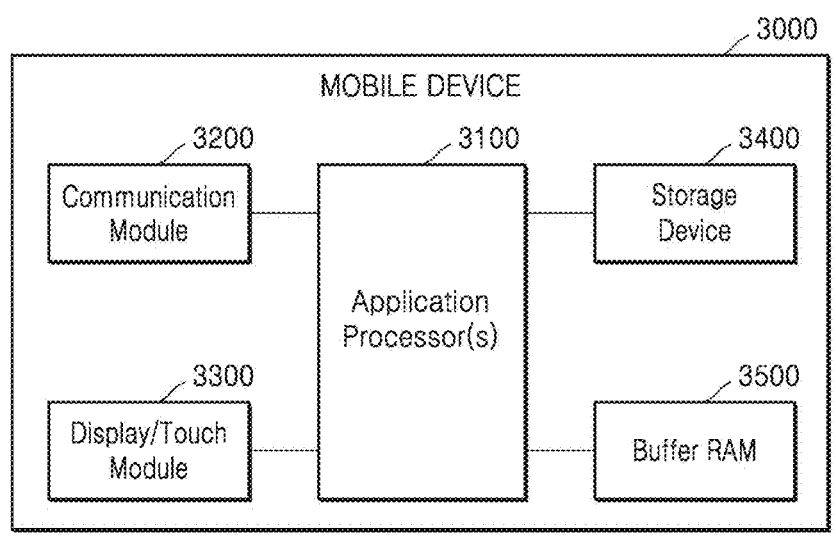
FIG. 17 is a block diagram illustrating an example of a mobile device according to an example embodiment of some inventive concepts.

FIG. 17 is a block diagram illustrating an example of a mobile device 3000 according to an example embodiment of some inventive concepts.

Referring to FIG. 17, the mobile device 3000 may include an application processor 3100, a communication module 3200, a display/touch module 3300, a storage device 3400, and a mobile RAM 3500.

The application processor 3100 controls the overall operation of the mobile device 3000. The communication module 3200 may be implemented to control wired/wireless communication with the outside. The display/touch module 3300 may display data processed by the application processor 3100 or receive data from a touch panel.

The mobile RAM 3500 may be implemented to temporarily store data necessary for a processing operation of the mobile device 3000.

The storage device 3400 may be implemented to store data of a user. The storage device 3400 may be a memory card, eMMC, SSD, or UFS device. The storage device 3400 may be implemented as the storage device 100 shown in FIG. 1. The storage device 3400 may reduce a period of time or delay for a read operation according to a multi-plane operation method according to some example embodiments of some inventive concepts.

The storage device according to some example embodiments of some inventive concepts may be implemented using various types of packages. In some example embodiments, the storage device may be mounted using a package such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Some inventive concepts have been shown and described with reference to some example embodiments thereof. The terminology used herein is for the purpose of describing some example embodiments only and is not intended to be limiting of the disclosure. Various changes in form and details may be made therein without departing from the spirit and scope of some inventive concepts as defined by the appended claims.

As used herein, terms such as "when" and "while" may, but are not necessarily intended to, imply a chronological relationship such as a sequence of events. For example, operations that are described as occurring "when" or "while" a condition is fulfilled may be performed concurrently with the fulfillment of the condition, or during the fulfillment of the condition, or after the fulfillment of the condition, or because the condition is fulfilled or has been fulfilled, etc. Similarly, phrases such as "on condition of" that associate an operation with a condition may indicate that the operation is performed concurrently with the fulfillment of the condition, or during the fulfillment of the condition, or after the fulfillment of the condition, or because the condition is fulfilled or has been fulfilled, etc. All such interpretations that are reasonably and logically possible, and that are not contradictory with other statements, are intended to be included in this disclosure, the scope of which is to be understood as being limited only by the claims.

What is claimed is:

1. A method of operating a storage device including a non-volatile memory, the non-volatile memory including a memory cell array, the memory cell array including a first plane and a second plane, the method comprising:
   receiving a read command set for data sensing of the first plane and the second plane;
   simultaneously loading first page data stored in the first plane into a first page buffer of the first plane and second page data stored in the second plane into a second page buffer of the second plane based on the read command set;
   receiving a data output command set that includes the first plane; and continuously transmitting the first page data and the second page data based on the data output command set, and the data output command set includes a first column address that identifies a specific first column of the first page buffer of the first plane.

2. The method of claim 1, wherein
the continuously transmitting includes continuously transmitting the second page data after completing the transmitting of the first page data, and
the continuously transmitting includes transmitting the second page data based on the data output command set rather than based on another data output command set including a second column address that identifies a specific second column of the second page buffer of the second plane.

3. The method of claim 1, wherein
the continuously transmitting includes transmitting data stored in the first specific column identified by the column address through a last column among a plurality of columns of the first page buffer.

4. The method of claim 1, wherein the continuously transmitting includes transmitting at least a portion of the first page data and all of the second page data based on the data output command set.

5. The method of claim 1, wherein the continuously transmitting includes transmitting the first page data and the second page data after completing the transmitting of the first page data based on the data output command set.

6. The method of claim 1, wherein the continuously transmitting includes,
transmitting the first page data based on the data output command set,
receiving a plane change command, and
transmitting the second page data of the second plane based on the plane change command.

7. The method of claim 6, wherein
receiving the data output command set includes receiving the data output command set during a plurality of write cycles, and
receiving the plane change command includes receiving the plane change command during one write cycle.

8. The method of claim 1, wherein the read command set includes an address of the first plane, an address of the second plane, and a multi-plane read command indicating a multi-plane read.

9. The method of claim 8, wherein the address of the first plane and the address of the second plane indicate a first page of the first plane and a second page of the second plane sensed, respectively, based on a read condition.

10. The method of claim 1, wherein the receiving of the data output command set includes,
receiving an address of the second plane, and
receiving an address of the first plane after receiving the address of the second plane.

11. A method of operating a storage device including a non-volatile memory, the non-volatile memory including a plurality of planes, the method comprising:
receiving a read-output command set for data sensing, the read-output command set including a read command, an address of a first plane, a multi-plane read command, an address of a second plane and a sequential read command indicating successive output of sensed page data of the plurality of planes; and
based on the read-output command set,
sensing data output for at least two planes of the plurality of planes,
loading at least two page data that are stored in the at least two planes of the plurality of planes into at least two page buffers that are respectively connected to the at least two planes, and
continuously outputting the at least two page data.

12. The method of claim 11, wherein the read-output command set includes a sequential read command indicating an end of the read-output command set and continuous output of all of the at least two page data sensed from the at least two planes.

13. The method of claim 12, wherein the sequential read command indicates output during one write cycle.

14. The method of claim 12, wherein the receiving of the read-output command set includes,
sequentially receiving a sequence of addresses of four planes, and
receiving the sequential read command.

15. A storage device comprising:
a non-volatile memory comprising a memory cell array, the memory cell array including a plurality of planes, respective planes of the plurality of planes being connected to a page buffer, wherein the non-volatile memory is configured to,
simultaneously load a first page data that is stored in a first plane of the plurality of planes into a first page buffer of the first plane, and a second page data that is stored in a second plane of the plurality of planes into a second page buffer of the second plane, wherein the simultaneously loading is based on a read command set, and
output the first page data and the second page data based on a data output command set; and
a memory controller configured to,
transmit the read command set and the data output command set to the non-volatile memory, and
receive the first page data and the second page data from the non-volatile memory,
wherein the non-volatile memory is further configured to,
receive a first data output command set from the memory controller, the first data output command set including a first column address specific to a column of the first page buffer,
output first page data loaded into the first page buffer based on the first data output command set,
output second page data loaded into the second page buffer based on the first data output command rather than a second data output command set, the second data output command set including a second column address specific to a column of the second page buffer.

16. The storage device of claim 15, wherein the non-volatile memory is further configured to output the second page data based on the first data output command rather than receiving a command from the memory controller after outputting the first page data.

17. The storage device of claim 15, wherein the memory controller is further configured to output a plane change command to the non-volatile memory after receiving the first page data.

18. The storage device of claim 17, wherein the non-volatile memory is further configured to,
receive the plane change command, and
output the second page data loaded into the second page buffer based on the plane change command.

19. The storage device of claim 15, wherein
the read command set identifies an address of a plane of the plurality of planes, and the read command set includes a multi-plane read command that indicates a multi-plane read.

\* \* \* \* \*